United States Patent
Zhuang et al.

(10) Patent No.: US 10,380,315 B2
(45) Date of Patent: Aug. 13, 2019

(54) INTEGRATED CIRCUIT AND METHOD OF FORMING AN INTEGRATED CIRCUIT

(71) Applicant: TAIWAN SEMICONDUCTOR MANUFACTURING COMPANY, LTD., Hsinchu (TW)

(72) Inventors: Hui-Zhong Zhuang, Kaohsiung (TW); Ting-Wei Chiang, New Taipei (TW); Lee-Chung Lu, Taipei (TW); Li-Chun Tien, Tainan (TW); Shun Li Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/682,885

(22) Filed: Aug. 22, 2017

(65) Prior Publication Data

US 2018/0075182 A1 Mar. 15, 2018

Related U.S. Application Data

(60) Provisional application No. 62/395,089, filed on Sep. 15, 2016.

(51) Int. Cl.
*G06F 17/50* (2006.01)
*H01L 27/02* (2006.01)
*H01L 27/118* (2006.01)

(52) U.S. Cl.
CPC ...... *G06F 17/5081* (2013.01); *G06F 17/5072* (2013.01); *H01L 27/0207* (2013.01);
(Continued)

(58) Field of Classification Search
CPC .................................................... G06F 17/5081
(Continued)

(56) References Cited

U.S. PATENT DOCUMENTS 5,977,830 A * 11/1999 Chen et al. ......... H01L 27/0207
257/207
7,564,077 B2 7/2009 Ko et al.
(Continued)

FOREIGN PATENT DOCUMENTS

KR 20150031248 3/2015
WO WO2013188410 12/2013

OTHER PUBLICATIONS

Office Action dated Aug. 7, 2018 from corresponding application No. KR 10-2017-0118547.
(Continued)

*Primary Examiner* — Sun J Lin
(74) *Attorney, Agent, or Firm* — Hauptman Ham, LLP

(57) ABSTRACT

An IC structure includes a cell, a first rail and a second rail. The cell includes a first and a second active region and a first gate structure. The first and second active region extend in a first direction and is located at a first level. The second active region is separated from the first active region in a second direction. The first gate structure extends in the second direction, overlaps the first and second active region, and is located at a second level. The first rail extends in the first direction, overlaps the first active region, is configured to supply a first supply voltage, and is located at a third level. The second rail extends in the first direction, overlaps the second active region, is located at the third level, separated from the first rail in the second direction, and is configured to supply a second supply voltage.

20 Claims, 18 Drawing Sheets

(52) U.S. Cl.
CPC ............... *H01L 27/11807* (2013.01); *H01L 2027/11881* (2013.01)

(58) Field of Classification Search
USPC .......................................... 716/118, 119, 120
See application file for complete search history.

(56) References Cited

U.S. PATENT DOCUMENTS

| | | | |
|---|---|---|---|
| 7,707,521 B2 | 4/2010 | Tsai et al. | |
| 7,821,039 B2 * | 10/2010 | Tien et al. | ............ H01L 27/092 257/207 |
| 7,919,792 B2 * | 4/2011 | Law et al. | .......... H01L 27/0207 257/202 |
| 8,723,268 B2 * | 5/2014 | Moroz et al. | ... H01L 21/823821 257/353 |
| 8,859,416 B2 * | 10/2014 | Doman et al. | ...... H01L 27/0207 257/774 |
| 8,863,063 B2 * | 10/2014 | Becker et al. | ........ H01L 27/092 716/118 |
| 8,975,677 B2 * | 3/2015 | Kito | .................... H01L 27/0733 257/296 |
| 9,035,393 B2 * | 5/2015 | Ma et al. | ............ H01L 27/0248 257/379 |
| 9,245,087 B1 * | 1/2016 | Schroeder et al. | ... H01L 29/785 |
| 9,595,478 B2 * | 3/2017 | Wang et al. | .... H01L 21/823828 |
| 9,639,650 B2 * | 5/2017 | Yuan et al. | .......... G06F 17/5077 |
| 9,734,276 B2 * | 8/2017 | Kim et al. | .......... G06F 17/5072 |
| 9,780,082 B2 * | 10/2017 | Lee et al. | ............ H01L 27/0207 |
| 9,805,983 B1 * | 10/2017 | Cheng et al. | ... H01L 21/823475 |
| 9,825,024 B2 * | 11/2017 | Jung | .................... H01L 27/0292 |
| 9,865,544 B2 * | 1/2018 | Jung | ...................... H01L 28/00 |
| 9,984,191 B2 * | 5/2018 | Hsieh et al. | ........ G06F 17/5072 |
| 2012/0228714 A1 | 9/2012 | Lim et al. | |
| 2017/0092638 A1 * | 3/2017 | Jung | .................. H01L 27/0292 |

OTHER PUBLICATIONS

Office Action dated Jan. 9, 2019 from corresponding application No. TW 106131714.

* cited by examiner

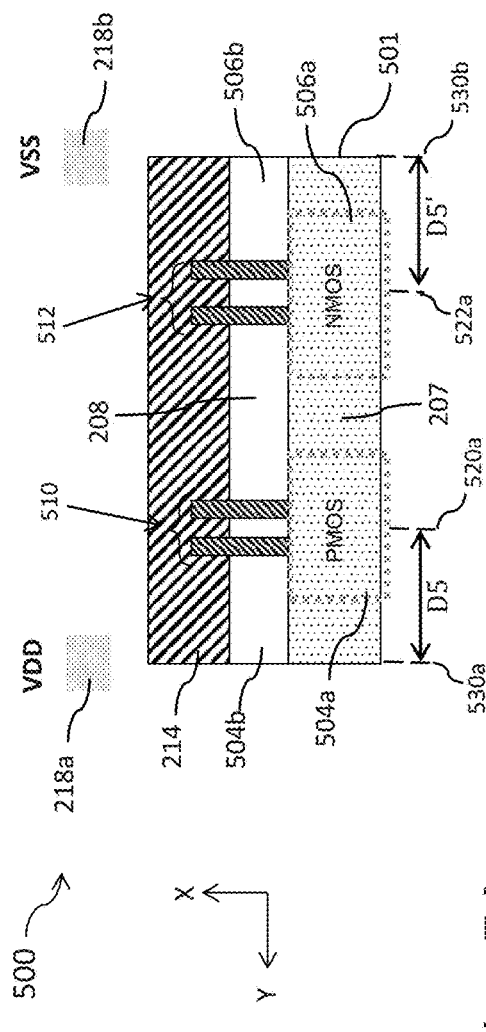
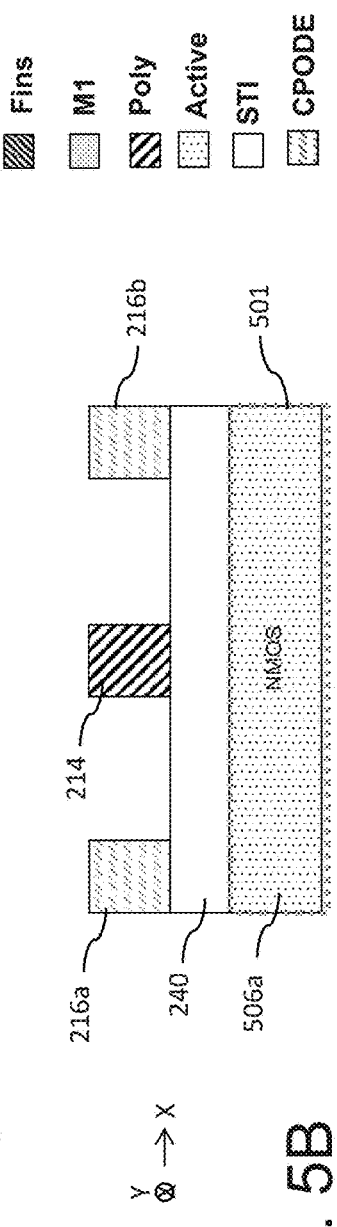
Fig. 5A
Fig. 5B

INTEGRATED CIRCUIT AND METHOD OF FORMING AN INTEGRATED CIRCUIT

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B are diagrams of an IC structure, in accordance with some embodiments.

DETAILED DESCRIPTION

Figure 1:
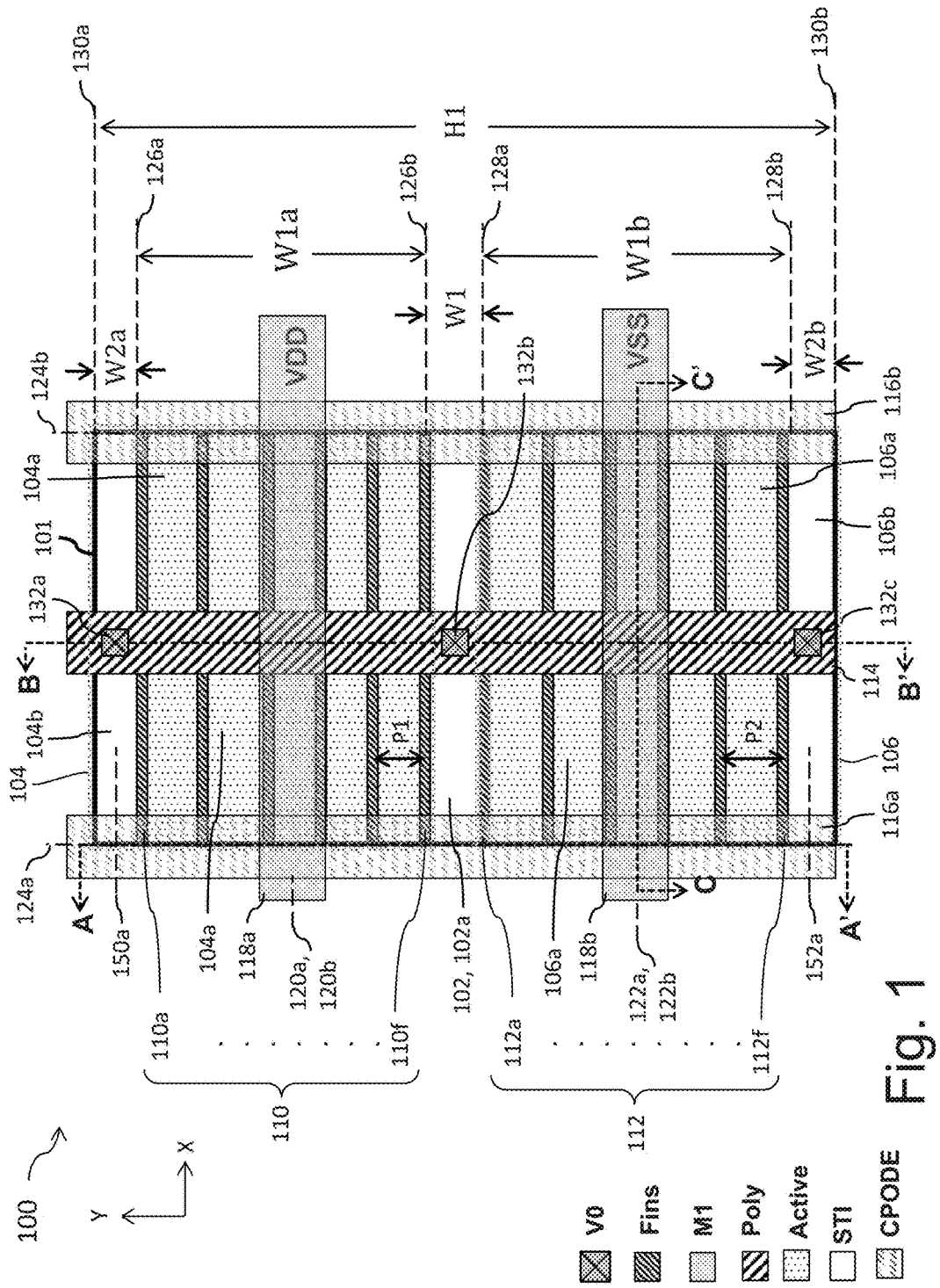
FIG. 1 is a diagram of a layout design of an IC structure, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an IC structure includes a first standard cell, a first rail and a second rail. The first standard cell includes a first active region, a second active region and a first gate structure. The first active region extends in a first direction and is located at a first level. The second active region extends in the first direction, is located at the first level, and is separated from the first active region in a second direction different from the first direction. The first gate structure extends in the second direction, overlaps the first active region and the second active region, and is located at a second level different from the first level.

The first rail extends in the first direction, overlaps the first active region, is configured to supply a first supply voltage, and is located at a third level different from the first level and the second level. The second rail extends in the first direction, overlaps the second active region, is located at the third level, is separated from the first rail in the second direction, and is configured to supply a second supply voltage different from the first supply voltage.

In some embodiments, a center of the first rail is aligned in the first direction with a center of the first active region. In some embodiments, a center of the second rail is aligned in the first direction with a center of the second active region. In some embodiments, the first active region is a p-type metal oxide semiconductor (PMOS) region, and the second active region is n-type metal oxide semiconductor (NMOS) region.

In some embodiments, in comparison with other approaches, the first active region and the second active region provide a larger area resulting in better speed performance and lower resistance.

FIG. 1 is a diagram of a layout design 100 of an IC structure, in accordance with some embodiments.

Layout design 100 includes a first region 102 between a second region 104 and a third region 106. First region 102 is adjacent to second region 104 and third region 106. First region 102 is on a same layout level as one or more of second region 104 or third region 106.

First region 102 includes a shallow trench isolation (STI) layout pattern 102a between second region 104 and third region 106. STI layout pattern 102a is usable to manufacture a corresponding STI structure 208 (shown in FIGS. 2A-2C) of an IC structure 200.

STI layout pattern 102a extends in a first direction X, and has a width W1 in a second direction Y different from the first direction X. In some embodiments, a center of STI layout pattern 102a is a center of layout design 100.

Second region 104 includes a first active region layout pattern 104a and an STI layout pattern 104b.

First active region layout pattern 104a extends in the first direction X, and has a width W1a in the second direction Y. First active region layout pattern 104a is usable to manufacture a corresponding first active region 204 (shown in FIGS. 2A-2C) of IC structure 200. A side of first active region layout pattern 104a is aligned with a side of STI layout pattern 104b along gridline 126a. A side of first active region layout pattern 104a is aligned with a side of STI layout pattern 102a along gridline 126b.

STI layout pattern 104b extends in first direction X and has a width W2a in second direction Y. A side of STI layout pattern 104b is aligned with a side 130a of layout design 100 in the first direction X.

Third region 106 includes a second active region layout pattern 106a and an STI layout pattern 106b.

Second active region layout pattern 106a extends in the first direction X, and has a width W1b in the second direction Y. Second active region layout pattern 106a is usable to manufacture a corresponding second active region 206a (shown in FIGS. 2A-2C) of IC structure 200. A side of second active region layout pattern 106a is aligned with a side of STI layout pattern 106b along gridline 128b. A side of second active region layout pattern 106a is aligned with a side of STI layout pattern 102a along gridline 128a. STI layout pattern 102a is between first active region layout pattern 104a and second active region layout pattern 106a. First active region layout pattern 104a or second active region layout pattern 106a is on a first layout level of layout design 100. Other configurations in the first active region layout pattern 104a and second active region layout pattern 106a are within the scope of the present disclosure.

STI layout pattern 106b extends in first direction X and has a width W2b in second direction Y. A side of STI layout pattern 106b is aligned with a side 130b of layout design 100. The side 130b of layout design 100 is an opposite side of layout design 100 from the side 130a of layout design 100. In some embodiments, a center of STI layout pattern 104b or 106b is aligned in the second direction Y with a center of layout design 100.

One or more of STI layout pattern 102a, 104b or 106b is on a second layout level of layout design 100. Second layout level of layout design 100 is different from first layout level. In some embodiments, the second layout level is above the first layout level. In some embodiments, the second layout level is below the first layout level.

Other configurations in STI layout pattern 102a, 104b or 106b are within the scope of the present disclosure.

In some embodiments, a width of widths W1, W1a, W1b, W2a, W2b, W4a (shown in FIG. 3A) or W4b (shown in FIG. 3A) is the same as a different width of widths W1, W1a, W1b, W2a or W2b. In some embodiments, a width of widths W1, W1a, W1b, W2a, W2b, W4a (shown in FIG. 3A) or W4b (shown in FIG. 3A) differs from a different width of widths W1, W1a, W1b, W2a, W2b, W4a (shown in FIG. 3A) or W4b (shown in FIG. 3A).

Layout design 100 further includes one or more fin layout patterns 110a, 110b, . . . , 110f (hereinafter referred to as a "first set of fin layout patterns 110") each extending in first direction X, and being over the first active region layout pattern 104a. Each of the layout patterns of the first set of fin layout patterns 110 is separated from an adjacent layout pattern of the first set of fin layout patterns 110 in the second direction Y by a fin pitch P1. The first set of fin layout patterns 110 is usable to manufacture a corresponding first set of fins 210 (shown in FIGS. 2A-2C) of IC structure 200. Other configurations or quantities of fins in the first set of fin layout patterns 110 are within the scope of the present disclosure.

Layout design 100 further includes one or more fin layout patterns 112a, 112b, . . . , 112f (hereinafter referred to as a "second set of fin layout patterns 112") each extending in first direction X, and being over the second active region layout pattern 106a. Each of the layout patterns of the second set of fin layout patterns 112 is separated from an adjacent layout pattern of the second set of fin layout patterns 112 in the second direction Y by a fin pitch P2. The fin pitch P2 is the same as the fin pitch P1. In some embodiments, at least one fin pitch P2 between a pair of adjacent layout patterns of the second set of fin layout patterns 112 is different from fin pitch P1 between a pair of adjacent layout patterns of the first set of fin layout patterns 110. The second set of fin layout patterns 112 is usable to manufacture a corresponding second set of fins 212 (shown in FIGS. 2A-2C) of IC structure 200. Other configurations or quantities in the second set of fin layout patterns 112 are within the scope of the present disclosure.

At least the first set of fin layout patterns 110 or the second set of fin layout patterns 110 is on the second layout level of layout design 100. In some embodiments, first set of fin layout patterns 110 or second set of fin layout patterns 110 is on a layout level of layout design 100 different from the second layout level.

Layout design 100 further includes a first gate layout pattern 114 extending in the second direction Y, and overlapping the first set of fin layout patterns 110 and the second set of fin layout patterns 112. First gate layout pattern 114 is usable to manufacture a corresponding first gate structure 214 (shown in FIGS. 2A-2C) of IC structure 200. In some embodiments, a center of the first gate layout pattern 114 is aligned in the second direction Y with the center of STI layout pattern 104b, 106b or the center of layout design 100. The first set of fin layout patterns 110 and the second set of fin layout patterns 112 are below the first gate layout pattern 114. Other configurations in first gate layout pattern 114 are within the scope of the present disclosure.

First gate layout pattern 114 is on a third layout level different from the first layout level and the second layout level. In some embodiments, the third layout level is above one or more of the first or second layout level. In some embodiments, the third layout level is below one or more of the first or second layout level.

Layout design 100 further includes a first dummy gate layout pattern 116a and a second dummy gate layout pattern 116b.

First dummy gate layout pattern 116a extends in the second direction Y, and is over a third side 124a of layout design 100. The first dummy gate layout pattern 116a is usable to manufacture a corresponding first dummy gate structure 216a (shown in FIGS. 2A-2C) of IC structure 200. In some embodiments, a center of the first dummy gate layout pattern 116a is aligned in the second direction Y with the third side 124a of layout design 100. In some embodiments, first dummy gate layout pattern 116a is a continuous polysilicon on oxide diffusion (OD) edge (CPODE) layout pattern. Other configurations in first dummy gate layout pattern 116a are within the scope of the present disclosure.

Second dummy gate layout pattern 116b extends in the second direction Y, and is over a fourth side 124b of layout design 100. The fourth side 124b of layout design 100 is an opposite side of layout design 100 from the third side 124a of layout design 100. The second dummy gate layout pattern 116b is usable to manufacture a corresponding second dummy gate structure 216b (shown in FIGS. 2A-2C) of IC structure 200. In some embodiments, a center of the second dummy gate layout pattern 116b is aligned in the second direction Y with the fourth side 124b of layout design 100. In some embodiments, second dummy gate layout pattern 116b is a CPODE layout pattern. Other configurations in second dummy gate layout pattern 116b are within the scope of the present disclosure. In some embodiments, at least one of first dummy gate layout pattern 116a or second dummy gate layout pattern 116b is a discontinuous set of dummy gate patterns (e.g., as shown in FIGS. 3A and 6B) extending in the second direction Y, and being spaced from each other in the second direction Y. In some embodiments, first dummy gate layout pattern 116a overlaps the third side 124a of layout design 100. In some embodiments, second dummy gate layout pattern 116b overlaps the fourth side 124b of layout design 100.

In some embodiments, second dummy gate layout pattern 116b is a CPODE layout pattern.

First dummy gate layout pattern 116a or second dummy gate layout pattern 116b is on the third layout level.

Layout design 100 further includes a first rail layout pattern 118a and a second rail layout pattern 118b.

First rail layout pattern 118a extends in the first direction X and overlaps the first active region layout pattern 104a. First rail layout pattern 118a is usable to manufacture a corresponding first rail 218a (shown in FIGS. 2A-2C) of IC structure 200. The first rail 218a is configured to supply a first supply voltage VDD. In some embodiments, the first rail 218a is configured to supply a second supply voltage VSS different from the first supply voltage VDD. First rail layout pattern 118a overlaps the third side 124a and the fourth side 124b of layout design 100. First rail layout pattern 118a is over a center 120a of the first active region layout pattern 104a. In some embodiments, first rail layout pattern 118a is over fin layout patterns 110c and 110d. In some embodiments, a center 120b of first rail layout pattern 118a is aligned in the first direction X with the center 120a of first active region layout pattern 104a.

Second rail layout pattern 118b extends in the first direction X and overlaps the second active region layout pattern 106a. Second rail layout pattern 118b is separated from the first rail layout pattern 118a in the second direction Y. Second rail layout pattern 118b is usable to manufacture a corresponding second rail 218b (shown in FIGS. 2A-2C) of IC structure 200. The second rail 218b is configured to supply the second supply voltage VSS. In some embodiments, the second rail 218b is configured to supply the first supply voltage VDD. Second rail layout pattern 118b overlaps the third side 124a and the fourth side 124b of layout design 100. Second rail layout pattern 118b is over a center 122a of the second active region layout pattern 106a. In some embodiments, second rail layout pattern 118b is over fin layout patterns 112c and 112d. In some embodiments, a center 122b of second rail layout pattern 118b is aligned in the first direction X with the center 122a of second active region layout pattern 106a. Other configurations of first rail layout pattern 118a or second rail layout pattern 118b are within the scope of the present disclosure.

First rail layout pattern 118a or second rail layout pattern 118b is on a fourth layout level different from the first layout level, the second layout level and the third layout level. In some embodiments, the fourth layout level is above one or more of the first, second or third layout level. In some embodiments, the fourth layout level is below one or more of the first, second or third layout level.

Layout design 100 further includes a set of via layout patterns 132a, 132b, and 132c. Set of via layout patterns 132a, 132b and 132c are over the first gate layout pattern 114. Set of via layout patterns 132a, 132b and 132c are usable to manufacture a corresponding set of vias 220a, 220b and 220c (shown in FIGS. 2A-2C) of IC structure 200. In some embodiments, a center of one or more via layout patterns of the set of via layout patterns 132a, 132b or 132c is over a center of the first gate layout pattern 114 or layout design 100. In some embodiments, the center of a via layout pattern of the set of via layout patterns 132a, 132b or 132c is aligned in the second direction Y with another via layout pattern of the set of via layout patterns 132a, 132b or 132c. Other configurations of via layout patterns 132a, 132b or 132c are within the scope of the present disclosure.

In some embodiments, layout design 100 is a standard cell 101 of an IC structure. Standard cell 101 has a width (not shown) in first direction X, and a height H1 in second direction Y. In some embodiments, standard cell 101 is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM) read only memory (ROM), or the like. In some embodiments, a standard cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drain, or the like. Examples of passive elements include, but are not limited to, capacitors, inductors, fuses, resistors, or the like. Standard cell 101 includes other features not shown for ease of illustration.

In some embodiments, first rail layout pattern 118a or second rail layout pattern 118b are part of standard cell 101, 301A-301C, 401, 701A-701D or array 601. In some embodiments, first rail layout pattern 118a or second rail layout pattern 118b are not part of standard cell 101, 301A-301C, 401, 601, 701A-701D or array 601.

In some embodiments, at least via layout pattern 132a, 132b, 132c, first dummy gate layout pattern 116a or the second dummy gate layout pattern 116b is part of standard cell 101, 301A-301C, 401, 701A-701D or array 601. In some embodiments, at least via layout pattern 132a, 132b, 132c, first dummy gate layout pattern 116a or the second dummy gate layout pattern 116b is not part of standard cell 101, 301A-301C, 401, 701A-701D or array 601.

First rail layout pattern 118a and second rail layout pattern 118b are inbound power layout patterns. In some embodiments, an inbound power layout pattern is a power layout pattern that does not overlap an edge of standard cell 101. In some embodiments, an outbound power layout pattern is a power layout pattern that overlaps an edge of standard cell 101.

In some embodiments, the first active region layout pattern 104a and the second active region layout pattern 106a have a larger area than other approaches. As the area of the first active region layout pattern 106a and second active area layout pattern 106a is increased, the corresponding active region (first active region 204a and second active region 206a) of IC structure 200 manufactured by layout design 100 is increased, resulting in a layout design and a corresponding IC structure (e.g., IC structure 200) with increased speed performance and power performance compared to other approaches.

In some embodiments, by the first rail layout pattern 118a or the second rail layout pattern 118b being inbound power rail layout patterns, a distance in the second direction Y between the first rail layout pattern 118a or the second rail layout pattern 118b and the corresponding first active region layout pattern 104a or second active region layout pattern 106a is smaller than outbound power rail layout patterns, and results in a layout design 100 that is used to manufacture an IC structure 200 with lower resistance, and faster speed than other approaches.

Figure 2A:
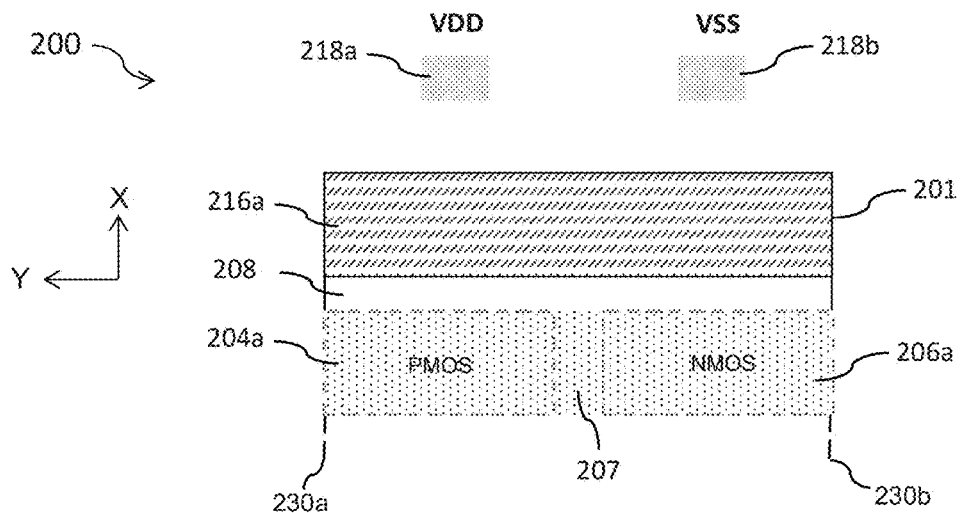
FIGS. 2A, 2B and 2C are diagrams of an IC structure, in accordance with some embodiments.
Figure 2B:
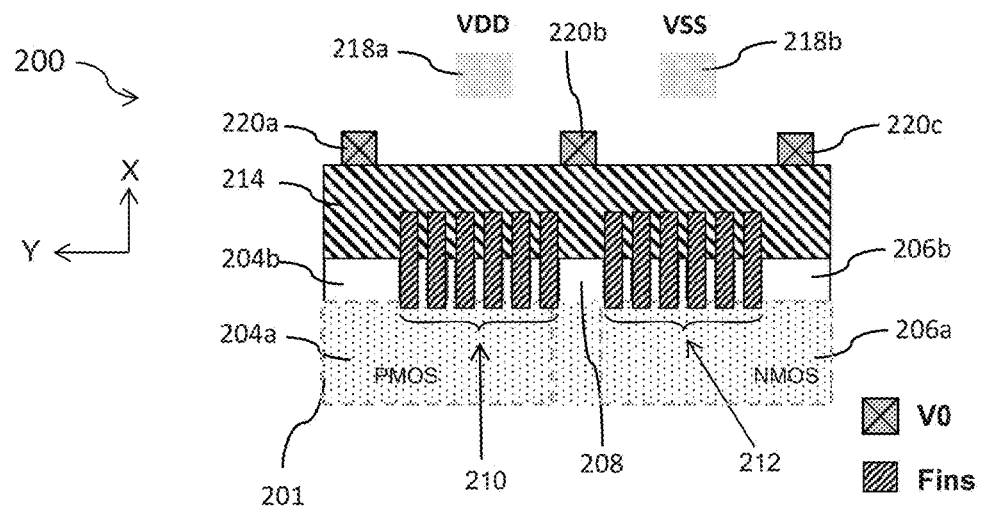
Figure 2C:
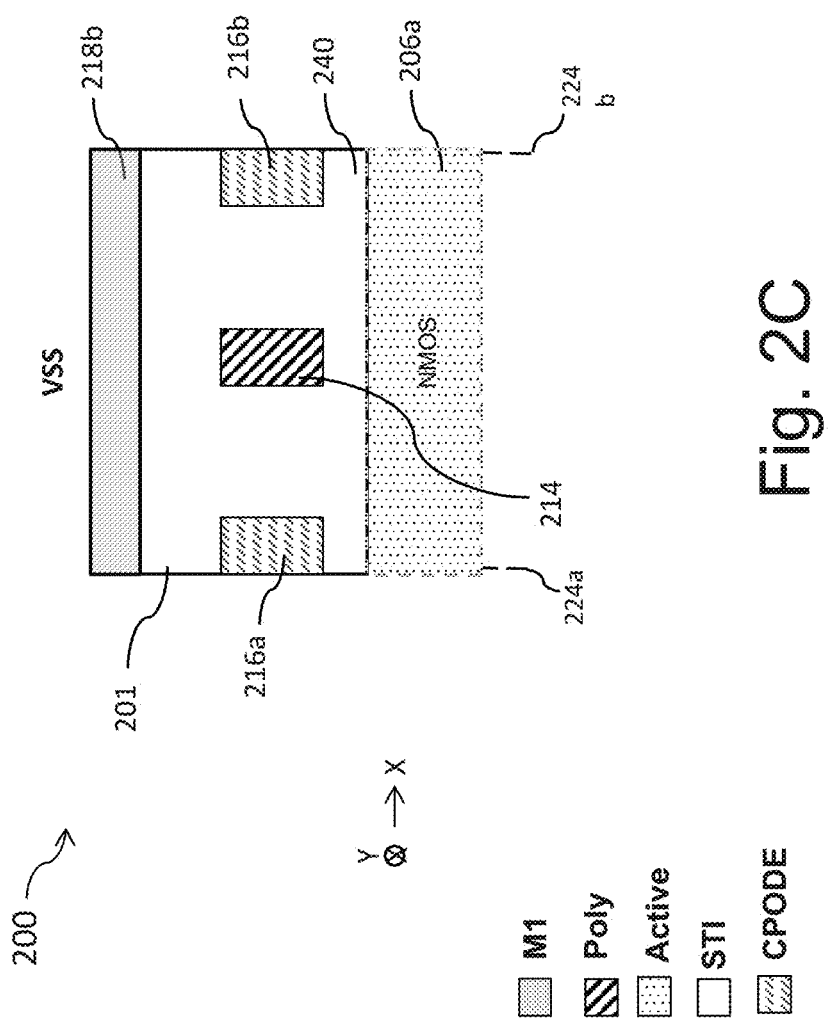
Figure 3A:
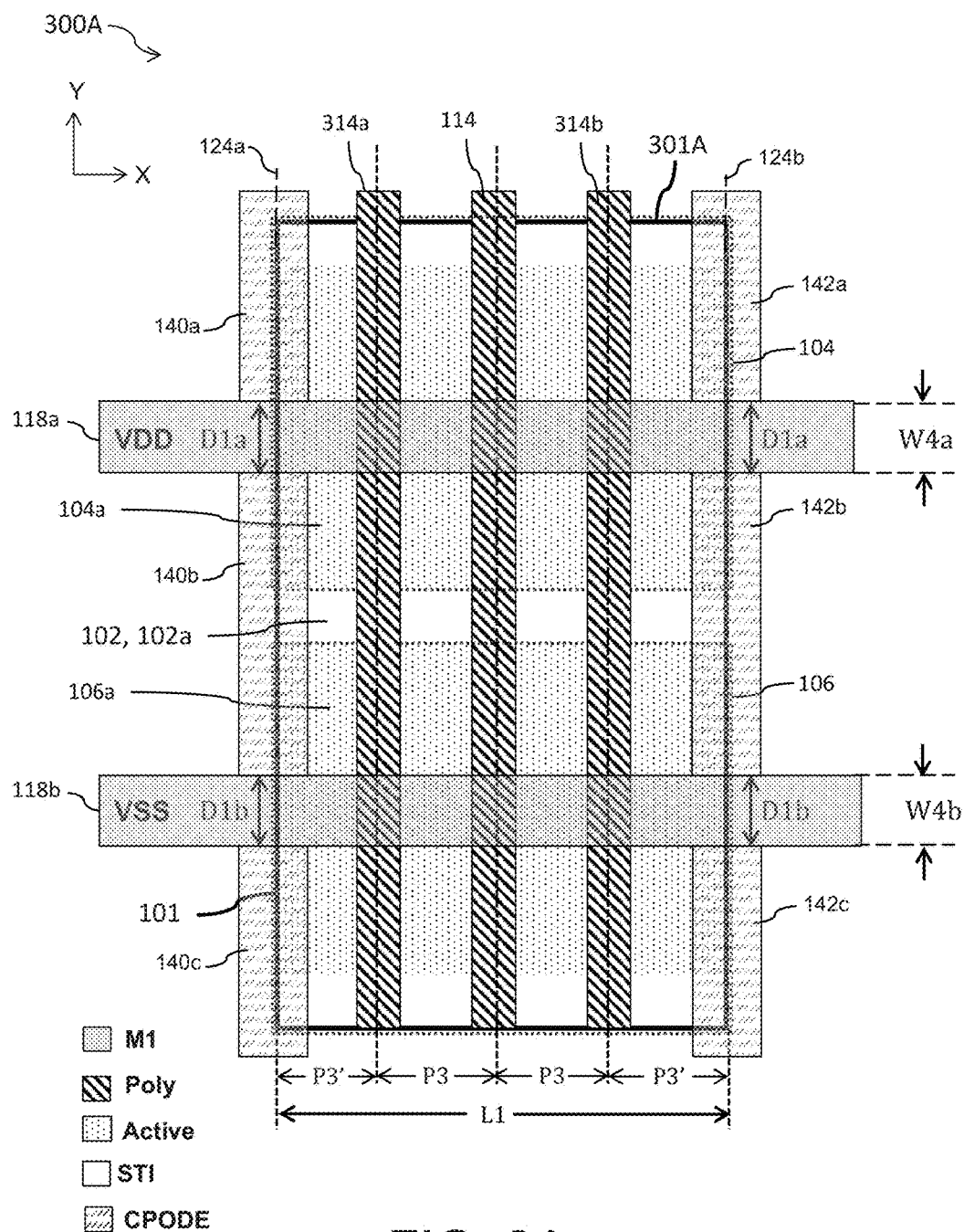
FIG. 3A is a diagram of a layout design of an IC structure, in accordance with some embodiments.

FIGS. 2A, 2B and 2C are diagrams of an IC structure 200, in accordance with some embodiments. FIG. 2A is a cross-sectional view of IC structure 200 corresponding to layout design 100 as intersected by plane A-A', FIG. 2B is a cross-sectional view of IC structure 200 corresponding to layout design 100 as intersected by plane B-B', and FIG. 2C is a cross-sectional view of IC structure 200 corresponding to layout design 100 as intersected by plane C-C', in accordance with some embodiments. IC structure 200 is manufactured by layout design 100.

Structural relationships and configurations of IC structure 200 are similar to the structural relationships and configurations of layout design 100 of FIG. 1, and will not be described in FIGS. 2A-2C for brevity.

IC structure 200 includes a first active region 204a, a second active region 206a and an intermediary region 207.

First active region 204a is on a first level of IC structure 200. First active region 204a represents a source and/or drain diffusion portion of at least one transistor having a first dopant type. The first dopant type is a p-dopant type. In some embodiments, the at least one transistor includes at least one p-type metal oxide semiconductor (PMOS) transistor, and the first active region 204a is the source or drain portion of the at least one PMOS transistor in IC structure 200. In some embodiments, the first dopant type is an n-dopant type, the at least one transistor includes at least one n-type metal oxide semiconductor (NMOS) transistor, and the first active region 204a is the source or drain portion of the at least one NMOS transistor in IC structure 200. First active region 204a and second active region 206a are connected by intermediary region 207.

Second active region 206a is on the first level of IC structure 200. Second active region 206a represents a source or drain diffusion portion of at least one transistor having a second dopant type. The second dopant type is an n-dopant type. In some embodiments, the at least one transistor includes at least one NMOS transistor, and the second active region 206a is the source or drain portion of the at least one NMOS transistor in IC structure 200. In some embodiments, the second dopant type is a p-dopant type, and the at least one transistor includes at least one PMOS transistor, and the second active region 206a is the source or drain portion of the at least one PMOS transistor in IC structure 200. In some embodiments, first active region 204a or second active region 206a is referred to as an oxide-definition (OD) region of IC structure 200 which defines the source or drain diffusion regions of IC structure 200. In some embodiments, the first dopant type of the first active region 204a is different from the second dopant type of the second active region 206a. For example, in some embodiments, if the first dopant type of the first active region 204a is an n-dopant type, then the second dopant type of the second active region 206a is a p-dopant type, and IC structure 200 is referred to as an NNPP structure. For example, in some embodiments, if the first dopant type of the first active region 204a is a p-dopant type, then the second dopant type of the second active region 206a is an n-dopant type, and IC structure 200 is referred to as an PPNN structure.

Intermediary region 207 is on the first level of IC structure 200. Intermediary region 207 is between second active region 206a and first active region 204a. In some embodiments, one or more of first active region 204a, second active region 206a or intermediary region 207 is a portion of a substrate (not shown). Other configurations of first active region 204a, second active region 206a or intermediary region 207 are within the scope of the present disclosure.

IC structure 200 further includes a first set of fins 210 and a second set of fins 212 extending in the first direction X. Each fin of the first set of fins 210 is separated from an adjacent fin of the first set of fins 210 by STI 208. In some embodiments, the first set of fins 210 is part of the first active region 204a and has the first dopant-type. Each fin of the second set of fins 212 is separated from an adjacent fin of the second set of fins 212 by STI 208. In some embodiments, the second set of fins 212 is part of the second active region 206a and has the second dopant-type. Other configurations of first set of fins 210 or second set of fins 212 are within the scope of the present disclosure.

IC structure 200 further includes STI 208, STI 204b, STI 206b and STI 240. One or more of STI 208, STI 204b, STI 206b and STI 240 is on a second level of IC structure 200. The second level of IC structure 200 is above the first level of IC structure 200.

STI 208 separates the first set of fins 210 from the second set of fins 212. In some embodiments, STI 208 separates the first active region 204a and the second active region 206a.

STI 204b separates IC structure 200 or first set of fins 210 from other structures (not shown).

STI 206b separates IC structure 200 or second set of fins 212 from adjacent structures (not shown). In some embodiments, one or more of STI 208, STI 204b, STI 206b and STI 240 is a dielectric material. Other configurations of STI 208, STI 204b, STI 206b or STI 240 are within the scope of the present disclosure.

IC structure 200 further includes a first gate structure 214 overlapping at least the first set of fins 210, the second set of fins 212, STI 208, STI 204b or STI 206b. First gate structure 214 is on a third level of IC structure 200. The third level of IC structure 200 is above the first level and the second level of IC structure 200. In some embodiments, first gate structure 214 is polysilicon. In some embodiments, at least the first set of fins 210 or the second set of fins 212 is embedded within the first gate structure 214. Other configurations of first gate structure 214 are within the scope of the present disclosure.

IC structure 200 further includes a first dummy gate structure 216a and a second dummy gate structure 216b positioned on opposite sides of IC structure 200 from each other. First dummy gate structure 216a and a second dummy gate structure 216b is on the third level of IC structure 200.

In some embodiments, first dummy gate structure 216a or second dummy gate structure 216b is polysilicon. First dummy gate structure 216a and second dummy gate structure 216b are referred to as a CPODE structure. First dummy gate structure 216a overlaps a first side 224a of IC structure 200. Second dummy gate structure 216b overlaps a second side 224b opposite of the first side 224a of IC structure 200. In some embodiments, at least first dummy gate structure 216a or second dummy gate structure 216b are configured to separate IC structure 200 from other IC structures (not shown). IC structure 200 is an IC of a standard cell 201.

IC structure 200 further includes a first rail 218a and a second rail 218b on a fourth level of IC structure 200. The fourth level of IC structure 200 is above the first level, the second level and the third level of IC structure 200. In some embodiments the fourth level is a metal-one (M1) layer of IC structure 200.

First rail 218a overlaps the first active region 204a. In some embodiments, first rail 218a overlaps a center of the first active region 204a. First rail 218a is configured to supply the first supply voltage VDD. In some embodiments, first rail to 218a is configured to supply the second supply voltage VSS. First rail 218a does not overlap a third side 230a of IC structure 200.

Second rail 218b overlaps the second active region 206a. In some embodiments, second rail 218b overlaps a center of the first active region 204a. Second rail 218b is configured to supply the second supply voltage VSS. In some embodiments, second rail 218b is configured to supply the first supply voltage VDD. Second rail 218b does not overlap a fourth side 230b of IC structure 200 opposite of the third side 230a of IC structure 200. In some embodiments, first rail 218a or second rail 218b is on the M1 layer of IC structure 200. In some embodiments, at least one member of the first rail 218a or the second rail 218b is a conductive material including copper, aluminum, alloys thereof or other suitable conductive materials, that is formed in one or more metallization layers by one or more of a physical vapor deposition process, a chemical vapor deposition process, a plating process, or other suitable processes. Other configurations of first rail 218a or second rail 218b are within the scope of the present disclosure.

In some embodiments, first rail 218a or second rail 218b is part of standard cell 201 or 501. In some embodiments, first rail 218a or second rail 218b is not part of standard cell 201 or 501.

IC structure 200 further includes a set of vias 220a, 220b and 220c over first gate structure 214. The set of vias 220a, 220b and 220c are electrically coupled to the first gate structure 214, and are configured to provide an electrical connection to other layers (not shown). In some embodiments, at least one via of the set of vias 220a, 220b or 220c is over a center of the first gate structure 214. In some embodiments, the set of vias 220a, 220b and 220c are on a V0 layer of IC structure 200. In some embodiments, at least one via of the set of vias 220a, 220b or 220c is a metal line, a via, a through silicon via (TSV), an inter-level via (ILV), a slot via, an array of vias, or another suitable conductive line. In some embodiments, at least one via of the set of vias 220a, 220b or 220c includes copper, aluminum, nickel, titanium, tungsten, cobalt, carbon, alloys thereof or another suitable conductive material, that is formed in one or more metallization layers by one or more of a physical vapor deposition process, a chemical vapor deposition process, a plating process, or other suitable processes. In some embodiments, at least one via of the set of vias 220a, 220b or 220c includes one or more conductive line portions. Other configurations, materials or quantities of the set of vias 220a, 220b and 220c are within the scope of the present disclosure.

In some embodiments, at least via 220a, 220b or 220c is part of standard cell 201 or 501. In some embodiments, at least via 220a, 220b is 220c is not part of standard cell 201 or 501. In some embodiments, at least the first dummy gate structure 216a or the second dummy gate structure 216b is part of standard cell 201 or 501. In some embodiments, at least the first dummy gate structure 216a or the second dummy gate structure 216b is not part of standard cell 201 or 501.

In some embodiments, the first, second, third or fourth level is used interchangeably with the corresponding first, second, third or fourth layer of the IC structure 200 or 500.

IC structure 200 includes other levels or layers where elements are not shown for clarity of the present disclosure. In some embodiments, the first active region 204a and the second active region 206a have a larger area than other approaches. As the area of the first active region and second active region 206a of IC structure 200 is increased, IC structure 200 has increased speed performance and power performance compared to other approaches.

FIG. 3A is a layout design 300A of an IC structure, in accordance with some embodiments. Layout design 300A is a layout design of a multi-gate IC structure (not shown). Components that are the same or similar to those in each of FIGS. 1, 2A-2C, 3A-3C, 4, 5A-5B, 6A-6B and 7A-7D are given the same reference numbers, and detailed description thereof is thus omitted.

Layout design 300A is a variation of layout design 100 of FIG. 1. In comparison with layout design 100 of FIG. 1, layout design 300A further includes a second gate layout pattern 314a and a third gate layout pattern 314B, and dummy gate layout patterns 140a, 140b and 140c replace first dummy gate layout pattern 116a, and dummy gate layout patterns 142a, 142b and 142c replace second dummy gate layout pattern 116b.

For ease of illustration, the first set of fin layout patterns 110 and the second set of fin layout patterns 112 in FIG. 1 are not shown in FIGS. 3A-3C, 4, 6B and 7A-7D.

Second gate layout pattern 314a and third gate layout pattern 314b are similar to first gate layout pattern 114, and detailed description is therefore omitted.

Dummy gate layout patterns 140a, 140b and 140c are similar to first dummy gate layout pattern 116a, and dummy gate layout patterns 142a, 142b and 142c are similar to second dummy gate layout pattern 116b, and detailed description is therefore omitted.

Second gate layout pattern 314a and third gate layout pattern 314b extend in the second direction Y, and overlap at least the first active region layout pattern 104a, second active region layout pattern 106a, STI layout pattern 102a, STI layout pattern 104b, STI layout pattern 106b, first set of fin layout patterns 110 or the second set of fin layout patterns 112. Second or third gate layout pattern 314a or 314b is usable to manufacture a corresponding second or third gate structure (not shown) of IC structure 200.

First gate layout pattern 114 is between the second gate layout pattern 314a and the third gate layout pattern 314b.

Each gate layout pattern of the first gate layout pattern 114, the second gate layout pattern 314a or the third gate layout pattern 314b is separated from an adjacent gate layout pattern of the first gate layout pattern 114, the second gate layout pattern 314a or the third gate layout pattern 314b by a pitch P3.

Second gate layout pattern 314a is separated from dummy gate layout patterns 140a, 140b and 140c in the first direction X by a pitch P3'. Third gate layout pattern 314b is separated from dummy gate layout patterns 142a, 142b and 142c in the first direction X by a pitch P3'. In some embodiments, pitch P3 is the same as pitch P3'. In some embodiments, pitch P3 differs from pitch P3'.

Dummy gate layout pattern 140a or 142a is separated from corresponding dummy gate layout pattern 140b or 142b by a distance D1a. Dummy gate layout pattern 140b or 142b is separated from corresponding dummy gate layout pattern 140c or 142c by a distance D1b. First rail layout pattern 118a and second rail layout pattern 118b have a corresponding width W4a and W4b in in the second direction Y. In some embodiments, a width of widths W4a, W4b or a distance of distances D1a, D1b is the same as a different width of widths W4a, W4b or a different distance of distances D1a, D1b. In some embodiments, a width of widths W4a, W4b or a distance of distances D1a, D1b is differs from a different width of widths W4a, W4b or a different distance of distances D1a, D1b.

Layout design 300A has a length L1 in the first direction X. In some embodiments, length L1 is increased to accommodate a greater number of gate layout patterns. As the number of gate layout patterns 114, 314a, 314b is increased in layout design 300A, the speed of IC structure is increased and power performance of IC structure is improved compared to other designs. Other configurations or numbers of gate layout patterns or dummy gate layout patterns are within the scope of the present disclosure.

Figure 3B:
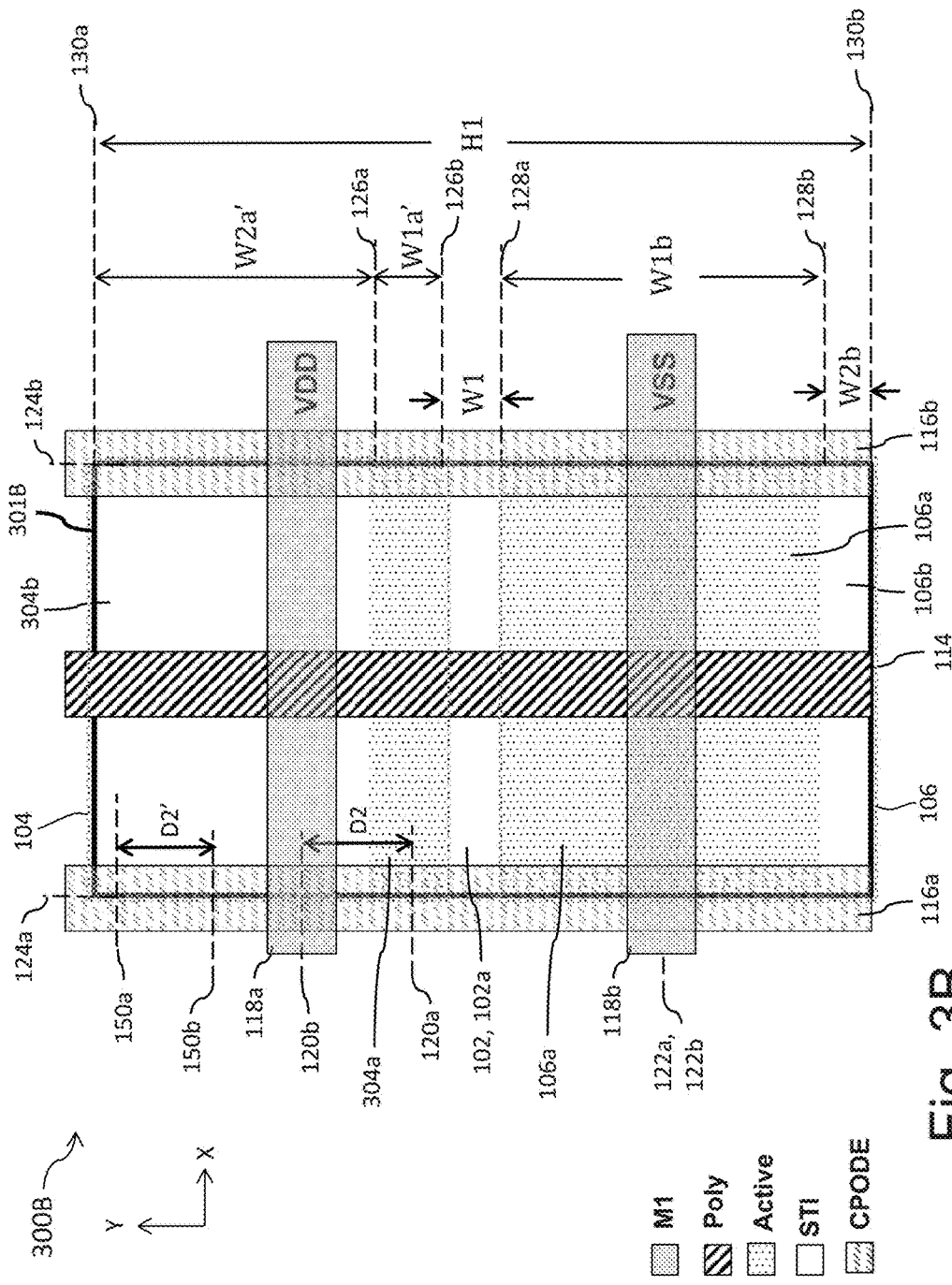
FIG. 3B is a diagram of a layout design of an IC structure, in accordance with some embodiments.

FIG. 3B is a layout design 300B of an IC structure, in accordance with some embodiments.

Layout design 300B is a variation of layout design 100 of FIG. 1. In comparison with layout design 100 of FIG. 1, a first active region layout pattern 304a of layout design 300B replaces the first active region layout pattern 104a of FIG. 1, and an STI layout pattern 304b of layout design 300B replaces STI layout pattern 104b of FIG. 1.

First active region layout pattern 304a is similar to first active region layout pattern 104a, STI layout pattern 304b is similar to STI layout pattern 104b, and similar detailed description of either layout pattern is therefore omitted.

First active region layout pattern 304a is usable to manufacture a corresponding first active region (not shown) of IC structure 200, and STI layout pattern 304b is usable to manufacture a corresponding STI (not shown) of IC structure 200.

First active region layout pattern 304a has a width W1a' in the second direction Y. Width W1a' of first active region layout pattern 304a is different from width W1a of first active region layout pattern 104a of FIG. 1 or width W1b of second active region layout pattern 106a.

A center 120a of first active region layout pattern 304a is offset or shifted from a center 120b of first rail layout pattern 118a by a distance D2. In other words, the center 120a of first active region layout pattern 304a is not aligned with a center 120b of first rail layout pattern 118a. In some embodiments, first rail layout pattern 118a does not overlap first active region layout pattern 304a. In some embodiments, first rail layout pattern 118a overlaps a portion of first active region layout pattern 304a.

STI layout pattern 304b has a width W2a' in the second direction Y. Width W2a' of STI layout pattern 304b is different from width W2a of STI layout pattern 104b of FIG. 1 or width W2b of STI layout pattern 106b. A center 150b of STI layout pattern 304b is shifted from a center 150a of STI layout pattern 104b of FIG. 1 by a distance D2'. In some embodiments, the center 150b of STI layout pattern 304b is not aligned with the center 120b of first rail layout pattern 118a. In some embodiments, the center 150b of STI layout pattern 304b is aligned with the center 120b of first rail layout pattern 118a. In some embodiments, first rail layout pattern 118a overlaps STI layout pattern 304b.

In some embodiments, a width of widths W1, W1a', W2a', W2b, W4a (shown in FIG. 3A) or W4b (shown in FIG. 3A) or a distance of distances D2 or D2' is the same as a different width of widths W1, W1a', W2a', W2b, W4a (shown in FIG. 3A) or a different distance of distances D2 or D2'. In some embodiments, a width of widths W1, W1a', W2a', W2b, W4a (shown in FIG. 3A) or W4b (shown in FIG. 3A) or a distance of distances D2 or D2' differs from a different width of widths W1, W1a', W2a', W2b, W4a (shown in FIG. 3A) or a different distance of distances D2 or D2'.

Figure 3C:
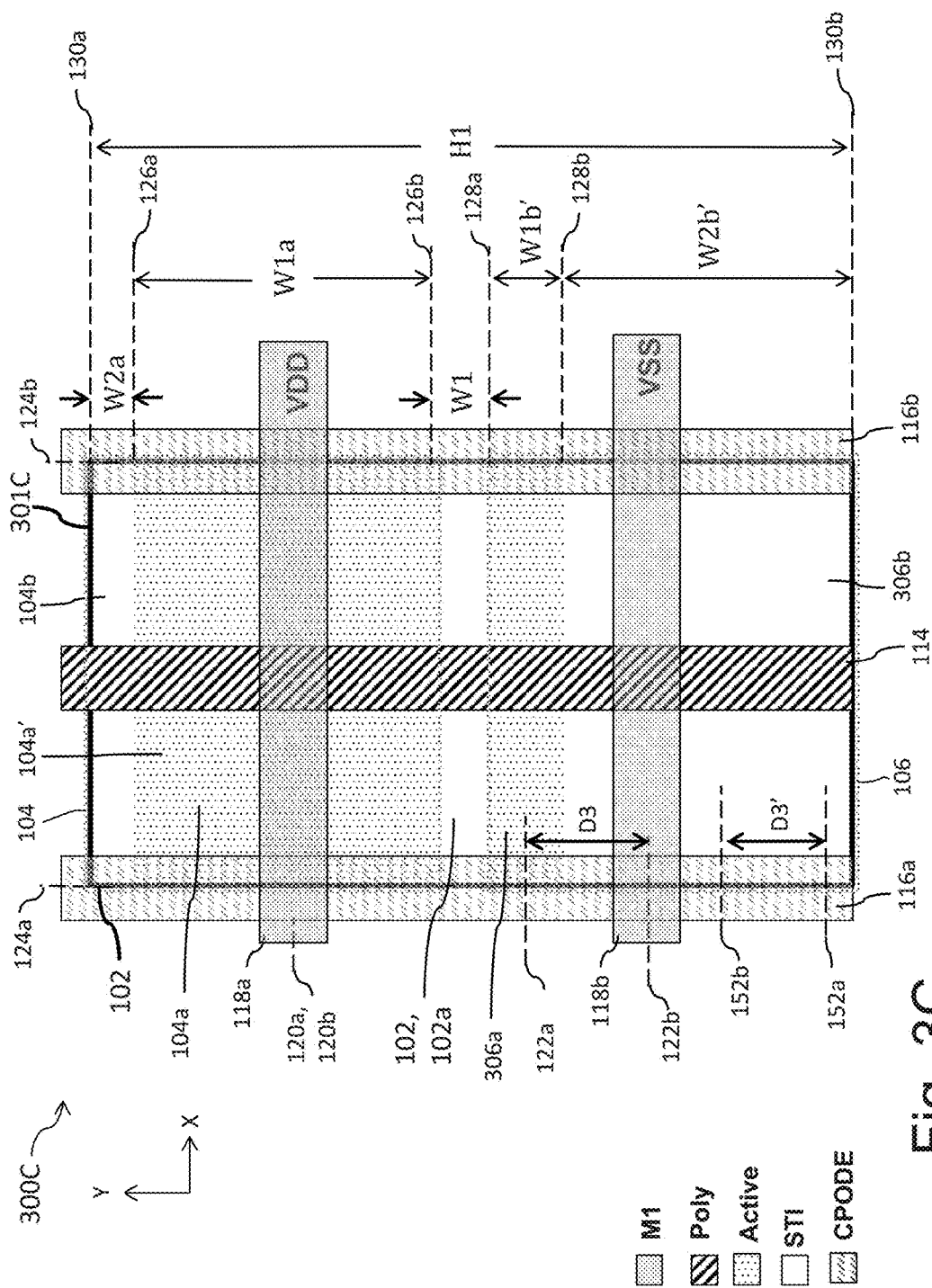
FIG. 3C is a diagram of a layout design of an IC structure, in accordance with some embodiments.

FIG. 3C is a layout design 300C of an IC structure, in accordance with some embodiments.

Layout design 300C is a variation of layout design 100 of FIG. 1. In comparison with layout design 100 of FIG. 1, a second active region layout pattern 306a of layout design 300C replaces the second active region layout pattern 106a of FIG. 1, and an STI layout pattern 306b of layout design 300C replaces the STI layout pattern 106b of FIG. 1.

Second active region layout pattern 306a is similar to second active region layout pattern 106a, STI layout pattern 306b is similar to STI layout pattern 106b, and similar detailed description of either layout pattern is therefore omitted.

Second active region layout pattern 306a is usable to manufacture a corresponding second active region (not shown) of IC structure 200, and STI layout pattern 306b is usable to manufacture a corresponding STI (not shown) of IC structure 200.

Second active region layout pattern 306a has a width W1b' in the second direction Y. Width W1b' of second active region layout pattern 306a is different from width W1b of second active region layout pattern 106a of FIG. 1 or width W1a of first active region layout pattern 104a.

A center 122a of second active region layout pattern 306a is offset or shifted from a center 122b of second rail layout pattern 118b by a distance D3. In other words, the center 122a of second active region layout pattern 306a is not aligned with the center 122b of second rail layout pattern 118b. In some embodiments, second rail layout pattern 118b does not overlap second active region layout pattern 306a. In some embodiments, first rail layout pattern 118a overlaps a portion of second active region layout pattern 306a.

STI layout pattern 306b has a width W2b' in the second direction Y. Width W2b' of STI layout pattern 306b is different from width W2b of STI layout pattern 106b of FIG. 1 or width W2a of STI layout pattern 104b. A center 152b of STI layout pattern 306b is shifted from a center 152a of STI layout pattern 106b of FIG. 1 by a distance D3'. In some embodiments, the center 152b of STI layout pattern 306b is not aligned with the center 122b of second rail layout pattern 118b. In some embodiments, the center 152b of STI layout pattern 306b is aligned with the center 122b of second rail layout pattern 118b. In some embodiments, second rail layout pattern 118b overlaps STI layout pattern 306b. In some embodiments, distance D3' is the same as distance D3. In some embodiments, distance D3' is different from distance D3.

In some embodiments, a width of widths W1, W1a, W1b', W2a, W2b', W4a (shown in FIG. 3A) or W4b (shown in FIG. 3A) or a distance of distances D3 or D3' is the same as a different width of widths W1, W1a, W1b', W2a, W2b', W4a (shown in FIG. 3A) or a different distance of distances D3 or D3'. In some embodiments, a width of widths W1, W1a, W1b', W2a, W2b', W4a (shown in FIG. 3A) or W4b (shown in FIG. 3A) or a distance of distances D3 or D3' differs from a different width of widths W1, W1a, W1b', W2a, W2b', W4a (shown in FIG. 3A) or a different distance of distances D3 or D3'. In some embodiments, the first active region layout pattern 104a and the second active region layout pattern 106a have a larger area than other approaches. As the area of the first active region layout pattern 106a and second active area layout pattern 106a is increased, the corresponding active region (first active region 204a and second active region 206a) of IC structure 200 manufactured by layout design 100 is increased, resulting in a layout design and a corresponding IC structure (e.g., IC structure 200) with increased speed performance and power performance compared to other approaches.

Figure 4:
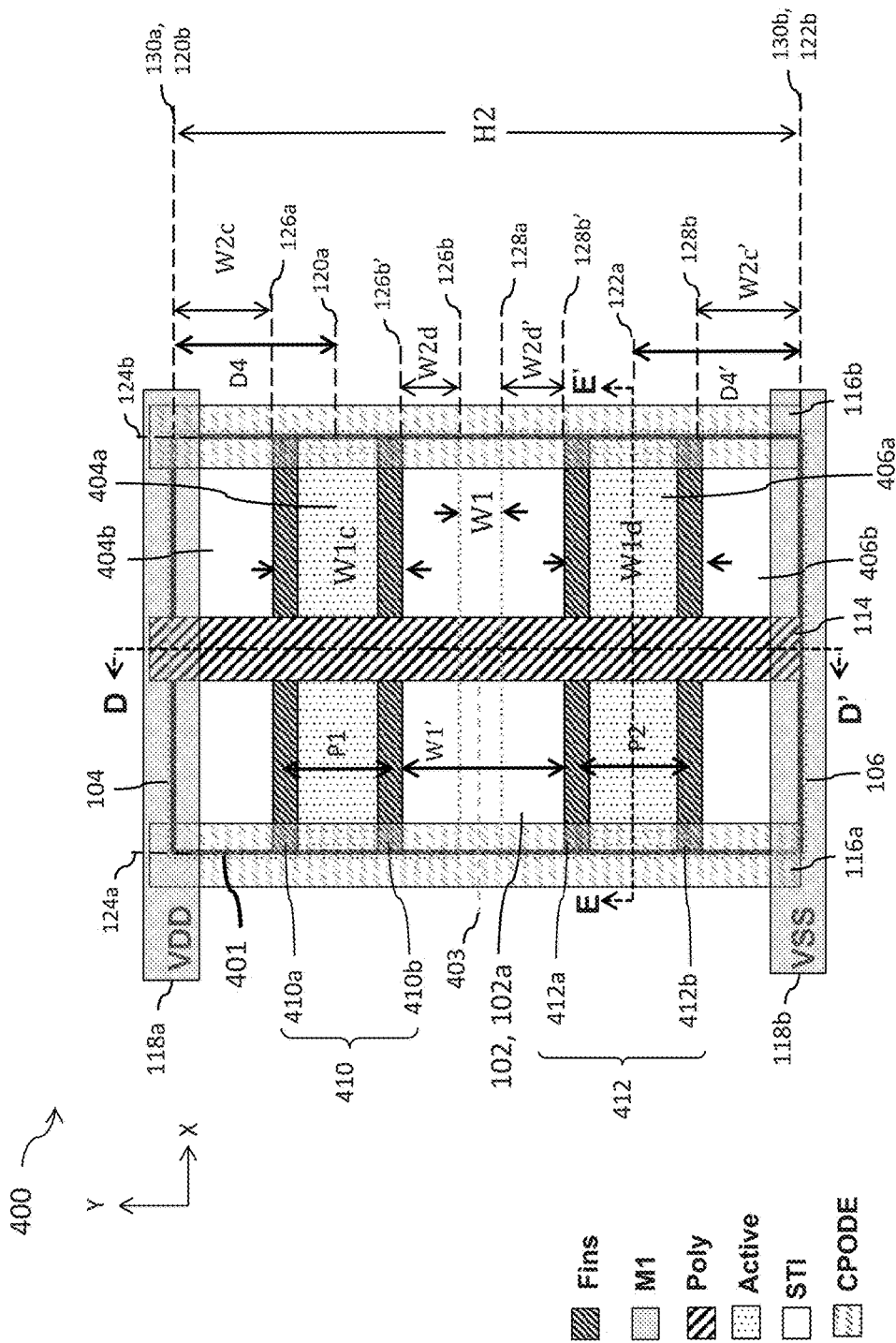
FIG. 4 is a diagram of a layout design of an IC structure, in accordance with some embodiments.

FIG. 4 is a diagram of a layout design 400 of an IC structure, in accordance with some embodiments.

Layout design 400 is a variation of layout design 100 of FIG. 1. In comparison with layout design 100 of FIG. 1, a standard cell 401 of layout design 400 replaces standard cell 101 of FIG. 1, a first active region layout pattern 404a of layout design 400 replaces the first active region layout pattern 104a of FIG. 1, an STI layout pattern 404b of layout design 400 replaces STI layout pattern 104b, a second active region layout pattern 406a of layout design 400 replaces the second active region layout pattern 106a of FIG. 1, an STI layout pattern 406b of layout design 400 replaces the STI layout pattern 106b of FIG. 1, a first set of fin layout patterns 410 of layout design 400 replaces the first set of fin layout patterns 110 of FIG. 1 and a second set of fin layout patterns 412 of layout design 400 replaces the second set of fin layout patterns 112 of FIG. 1.

First active region layout pattern 404a is similar to first active region layout pattern 104a, second active region layout pattern 406a is similar to second active region layout pattern 106a, STI layout patterns 404b and 406b are similar to corresponding STI layout patterns 104b and 106b, first set of fin layout patterns 410 is similar to first set of fin layout patterns 110, second set of fin layout patterns 412 is similar to second set of fin layout patterns 112, and similar detailed description of these layout patterns is therefore omitted.

Standard cell 401 is similar to standard cell 101, and has a height H2. Height H2 of standard cell 401 differs from height H1 of standard cell 101. In some embodiments, height H1 is twice that of height H2. In other words, in some embodiments, height H2 is half of height H1. In some embodiments, if height H1 is twice that of height H2, standard cell 101 is referred to as a double height cell and standard cell 401 is referred to as a single height cell.

First rail layout pattern 118a of FIG. 4 and second rail layout pattern 118b of FIG. 4 are outbound power rail layout patterns. A center 120b of first rail layout pattern 118a of FIG. 4 is offset or shifted from a center 120a of first active region layout pattern 404a by a distance D4. In other words, the center 120a of first active region layout pattern 404a is not aligned with the center 120b of first rail layout pattern 118a. First rail layout pattern 118a does not overlap first active region layout pattern 404a. In some embodiments, first rail layout pattern 118a overlaps a portion of first active region layout pattern 404a. First rail layout pattern 118a overlaps the side 130a of standard cell 401. In some embodiments, the center 120b of first rail layout pattern 118a is aligned with the side 130a of standard cell 401. In some embodiments, first rail layout pattern 118a overlaps an edge of standard cell 401. In some embodiments, first rail layout pattern 118a overlaps a portion of STI layout pattern 404b.

A center 122b of second rail layout pattern 118b of FIG. 4 is offset or shifted from a center 122a of second active region layout pattern 406a by a distance D4'. In other words, the center 122a of second active region layout pattern 406a is not aligned with the center 122b of second rail layout pattern 118b. Second rail layout pattern 118b does not overlap second active region layout pattern 406a. In some embodiments, second rail layout pattern 118b overlaps a portion of second active region layout pattern 406a. Second rail layout pattern 118b overlaps the side 130b of standard cell 401. In some embodiments, the center 122b of second rail layout pattern 118b is aligned with the side 130b of standard cell 401. In some embodiments, second rail layout pattern 118b overlaps another edge of standard cell 401. In some embodiments, second rail layout pattern 118b overlaps a portion of STI layout pattern 406b.

First active region layout pattern 404a is usable to manufacture a corresponding first active region 504a (shown in FIGS. 5A-5B) of IC structure 500. First active region layout pattern 404a has a width W1c in the second direction Y. Width W1c of first active region layout pattern 404a is different from width W1a of first active region layout pattern 104a of FIG. 1. In some embodiments, the width W1c of first active region layout pattern 404a ranges from 10% to 20% of the width W1a of first active region layout pattern 104a.

STI layout pattern 404b is usable to manufacture a corresponding STI structure 504b (shown in FIGS. 5A-5B) of IC structure 500. STI layout pattern 404b has a width W2c in the second direction Y.

Second active region layout pattern 406a is usable to manufacture a corresponding second active region 506a (shown in FIGS. 5A-5B) of IC structure 500. Second active region layout pattern 406a has a width W1d in the second direction Y. Width W1d of second active region layout pattern 406a is different from width W1b of second active region layout pattern 106a of FIG. 1. In some embodiments, the width W1d of second active region layout pattern 406a ranges from 10% to 20% of the width W1b of second active region layout pattern 106a.

STI layout pattern 406b is usable to manufacture a corresponding STI structure 506b (shown in FIGS. 5A-5B) of IC structure 500. STI layout pattern 406b has a width W2c' in the second direction Y.

STI layout pattern 102a in FIG. 4 has a width W1' in the second direction Y. Width W1' of STI layout pattern 102a in FIG. 4 is the sum of width W1, width W2d and width W2d'.

First set of fin layout patterns 410 includes fin layout patterns 410a and 410b. Other configurations or quantities of fins in the first set of fin layout patterns 410 are within the scope of the present disclosure. The first set of fin layout patterns 410 is usable to manufacture a corresponding first set of fins 510 (shown in FIGS. 5A-5B) of IC structure 500.

Second set of fin layout patterns 412 includes fin layout patterns 412a and 412b. Other configurations or quantities of fins in the second set of fin layout patterns 412 are within the scope of the present disclosure. The second set of fin layout patterns 412 is usable to manufacture a corresponding second set of fins 512 (shown in FIGS. 5A-5B) of IC structure 500.

In some embodiments, a width of widths W1, W1c, W1d, W2c, W2c', W2d, W2d', W4a (shown in FIG. 3A) or W4b (shown in FIG. 3A) or a distance of distances D4 or D4' is the same as a different width of widths W1, W1c, W1d, W2c, W2c', W2d, W2d', W4a (shown in FIG. 3A) or a different distance of distances D4 or D4'. In some embodiments, a width of widths W1, W1c, W1d, W2c, W2c', W2d, W2d', W4a (shown in FIG. 3A) or W4b (shown in FIG. 3A) or a distance of distances D4 or D4' differs from a different width of widths W1, W1c, W1d, W2c, W2c', W2d, W2d', W4a (shown in FIG. 3A) or a different distance of distances D4 or D4'.

FIGS. 5A and 5B are diagrams of an IC structure 500, in accordance with some embodiments. FIG. 5A is a cross-sectional view of IC structure 500 corresponding to layout design 400 as intersected by plane D-D', and FIG. 5B is a cross-sectional view of IC structure 500 corresponding to layout design 400 as intersected by plane E-E', in accordance with some embodiments. IC structure 500 is manufactured by layout design 400. Components that are the same or similar to those in FIGS. 2A-2C are given the same reference numbers, and detailed description thereof is thus omitted.

Structural relationships and configurations of IC structure 500 are similar to the structural relationships and configurations of layout design 400 of FIG. 4, and will not be described in FIGS. 5A-5B for brevity.

IC structure 500 includes a first active region 504a, a second active region 506a, an intermediary region 207, STI 208, STI 504b, STI 506b, a first set of fins 510, a second set of fins 512, a first gate structure 214, a first dummy gate structure 216a, a second dummy gate structure 216b, a first rail 218a, a second rail 218b and STI 240. In some embodiments, IC structure is an IC of a standard cell 501.

First active region 504a is similar to first active region 204a, second active region 506a is similar to second active region 206a, STI 504b and 506b are similar to corresponding STI 204b and 206b, first set of fins 510 is similar to first set of fins 210, second set of fins 512 is similar to second set of fins 212, and similar detailed description of these structures is therefore omitted.

First rail 218a of FIG. 5 and second rail 218b of FIG. 5 are outbound power rails. A center of first rail 218a of FIG. 5 is offset or shifted from a center 520a of first active region 504a by a distance D5. In other words, the center 520a of first active region 504a is not aligned with the center of first rail 218a. First rail 218a does not overlap first active region 504a. In some embodiments, first rail 218a overlaps a portion of first active region 504a. First rail 218a overlaps a side 530a of standard cell 501. In some embodiments, the center of first rail 218a is aligned with the side 530a of standard cell 501. In some embodiments, first rail 218a overlaps an edge of standard cell 501. In some embodiments, first rail 218a overlaps a portion of STI 504b.

A center of second rail 218b of FIG. 5 is offset or shifted from a center 522a of second active region 506a by a distance D5'. In other words, the center 522a of second active region 506a is not aligned with the center of second rail 218b. Second rail 218b does not overlap second active region 506a. In some embodiments, second rail 218b overlaps a portion of second active region 506a. Second rail 218b overlaps a side 530b of standard cell 501. In some embodiments, the center of second rail 218b is aligned with the side 530b of standard cell 501. In some embodiments, second rail 218b overlaps another edge of standard cell 501. In some embodiments, second rail 218b overlaps a portion of STI 506b.

Figure 6A:
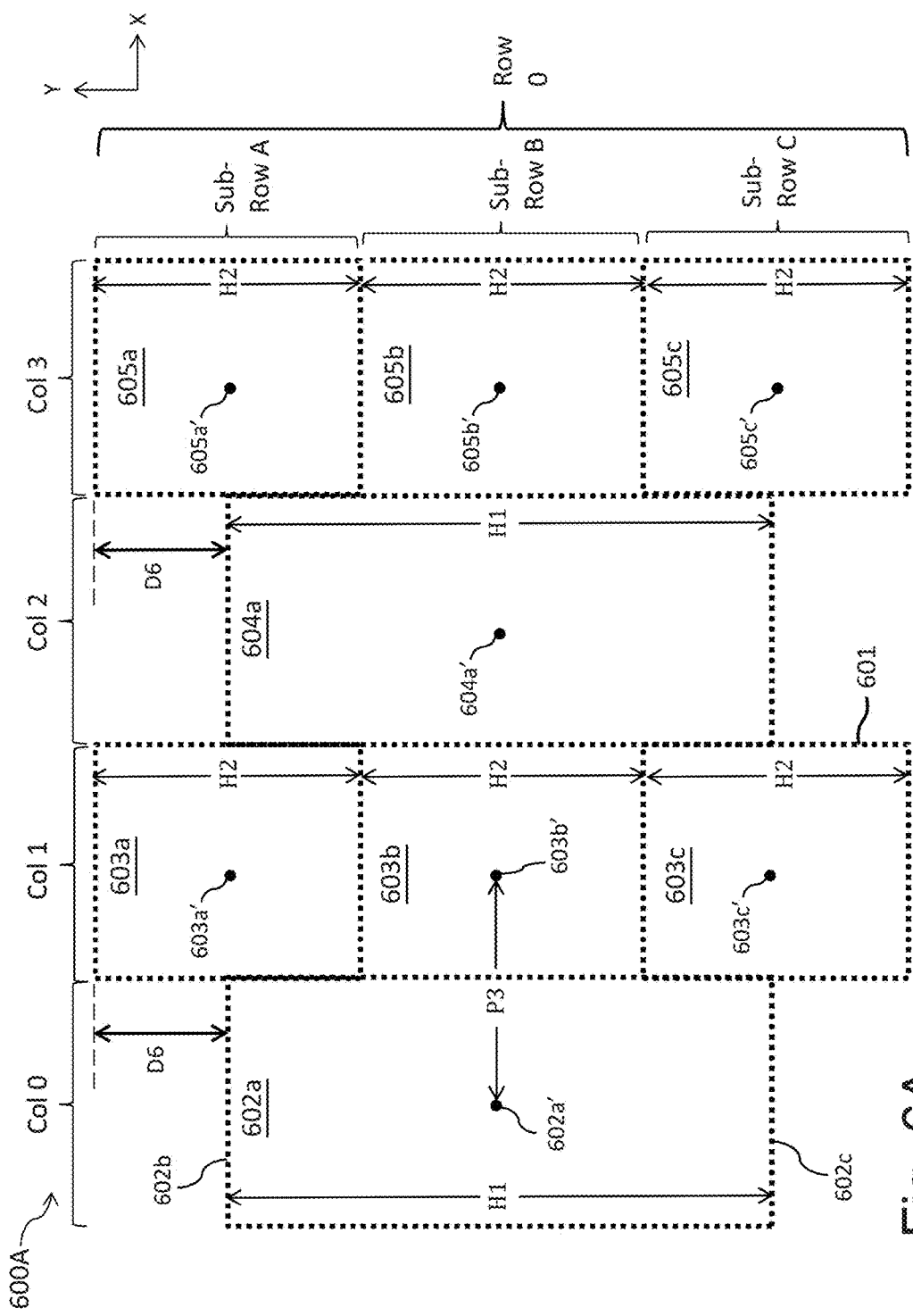
FIG. 6A is a diagram of a layout design of a portion of an IC structure, in accordance with some embodiments.
Figure 6B:
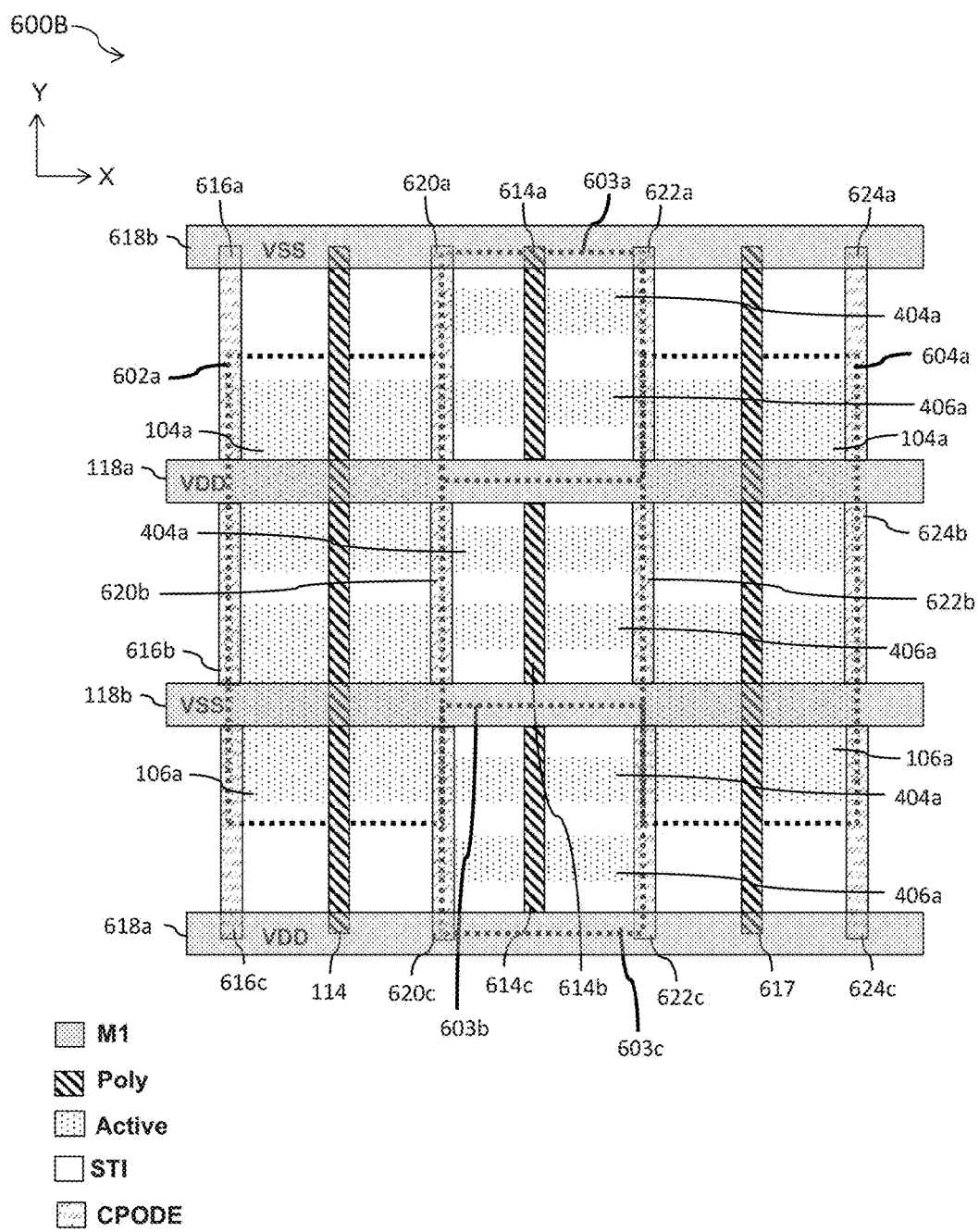
FIG. 6B is a diagram of a layout design of a portion of an IC structure, in accordance with some embodiments.

FIG. 6A is a diagram of a layout design 600A of a portion of an IC structure, in accordance with some embodiments. For ease of illustration, FIG. 6A includes additional elements not shown.

Layout design 600A includes an array 601 of standard cells having 1 row (e.g., Row 0) and 4 columns (e.g., Cols. 0, 1, 2 and 3). The 1 row of cells is arranged in the first direction X and the 4 columns of cells are arranged in the second direction Y. Row 0 is further divided to include 3 sub-rows (e.g., sub-rows A, B and C). The 3 sub-rows of cells are arranged in the first direction X. One row, three sub-rows and four columns of cells are used for illustration. A different number of rows, sub-rows or columns is within the contemplated scope of the present disclosure.

Each of the cells in array 601 corresponds to a standard cell of layout designs 100, 300A, 300B, 300C or 400.

Columns 0 and 2 of array 601 include corresponding cells 602a and 604a. Column 1 of array 601 includes cells 603a, 603b and 603c. Column 3 of array 601 includes cells 605a, 605b and 605c.

Row 0 of array 601 includes cells 602a, 603a, 603b, 603c, 604a, 605a, 605b or 605c. Cells 603a, 603b or 603c are in the same corresponding sub-row A, B or C as corresponding cells 605a, 605b and 605c. For example, sub-row A includes cells 603a and 605a, sub-row B includes cells 603b and 605b and sub-row C includes cells 603c and 605c.

A cell of cells 602a, 603a, 603b, 603c, 604a, 605a, 605b or 605c is standard cell 101, 301A, 301B, 301C or 400. In some embodiments, cells 602a or 604a is standard cells 101, 301A, 301B or 301C. In some embodiments, cells 603a, 603b, 603c, 605a, 605b or 605c is standard cell 401.

Cells 602a and 604a have a height H1 in the second direction Y, and cells 603a, 603b, 603c, 605a, 605b and 605c have a height H2 in the second direction Y. Height H1 of cells 602a or 604a differs from height H1 of cells 603a, 603b, 603c, 605a, 605b or 605c. In some embodiments, height H1 is twice that of height H2. In other words, in some embodiments, height H2 is half of height H1.

An edge of cells in adjacent columns in array 601 are separated from each other in the second direction Y by a distance D6. For example, an edge of cell 602a or 604a is offset or shifted in the second direction Y from an edge of cell 603a or 605a by a distance D6. Similarly, another edge of cell 602a or 604a is offset or shifted in the second direction Y from an edge of cell 603c or 605c by distance D6. In some embodiments, distance D6 is 50% of height H2. In some embodiments, distance D6 is 20% of height H1.

In some embodiments, one member of distance D6 or heights H1 or H2 is the same as a different member of distance D6 or heights H1 or H2. In some embodiments, one member of distance D6 or heights H1 or H2 differs from a different member of distance D6 or heights H1 or H2. In some embodiments, array 601 is an arrangement of cells of height H1 alternating with cells of height H2 in the first direction X.

Cells 602a, 603a, 603b, 603c, 604a, 605a, 605b and 605c have a corresponding center 602a', 603a', 603b', 603c', 604a', 605a', 605b' and 605c'.

A center between cells in adjacent columns in array 601 are separated from each other in the first direction X by a pitch P3. For example, a center 602a' of cell 602a is separated from a center 603b' of cell 603b by a pitch P3. Similarly, the center 603b' of cell 603b is separated from a center 604a' of cell 604a by pitch P3, and the center 604a' of cell 604a is separated from a center 605b' of cell 605b by pitch P3.

Different configurations of arrays, layout designs or cells is within the contemplated scope of the present disclosure.

FIG. 6B is a diagram of a layout design 600B of a portion of an IC structure, in accordance with some embodiments.

Layout design 600B is a variation of layout design 600A. In comparison with layout design 600A, layout design 600B further includes a variation of layout design 100 implemented in each of cells 602a and 604a, and layout design 400 implemented in each of cells 603a, 603b and 603c. In some embodiments, layout design 600B integrates the layout designs of standard cells 101, 301A, 301B, and 301C with standard cell 401.

For ease of illustration layout design 600A does not include cells 605a, 605b and 605c of column 3 of array 601, first set of fin layout patterns 110 and second set of fin layout patterns 112. Different configurations of layout designs or cells is within the contemplated scope of the present disclosure.

Each of the cells in array 601 corresponds to a standard cell of layout designs 100, 300A, 300B, 300C or 400. For example, cell 602a, 603a, 603b, 603c, 604a, 605a, 605b or 605c is standard cell 101, 301A, 301B, 301C or 400. In some embodiments, cells 602a or 604a is standard cells 101, 301A, 301B or 301C. In some embodiments, cells 603a, 603b, 603c, 605a, 605b or 605c is standard cell 401.

Cell 602a or 604a includes layout design 100 (e.g., standard cell 101). Cell 603a, 603b or 603c includes layout design 400 (e.g., standard cell 401). In some embodiments, one or more of layout designs 100, 300A-300C, 400, 700A-700D (shown in FIGS. 7A-7D) is implemented in one or more of cells 602a, 603a, 603b, 603c, 604a, 605a, 605b or 605c.

In comparison with layout design 100 of FIG. 1, dummy gate layout patterns 616a, 616b and 616c of cell 602a replace the first dummy gate layout pattern 116a of FIG. 1, and dummy gate layout patterns 620a, 620b and 620c of cell 602a replace the second dummy gate layout pattern 116b of FIG. 1. Alternatively, dummy gate layout patterns 620a, 620b and 620c are part of corresponding cells 603a, 603b and 603c, and replace the corresponding first dummy gate layout pattern 116a of FIG. 4 for each corresponding cell 603a, 603b and 603c.

Similarly, dummy gate layout patterns 622a, 622b and 622c of cell 604a replace the first dummy gate layout pattern 116a of FIG. 1, and dummy gate layout patterns 624a, 624b and 624c of cell 604a replace the second dummy gate layout pattern 116b of FIG. 1. Alternatively, dummy gate layout patterns 622a, 622b and 622c are part of corresponding cells 603a, 603b and 603c, and replace the corresponding second dummy gate layout pattern 116b of FIG. 4 for each corresponding cell 603a, 603b and 603c.

Dummy gate layout patterns 616a, 616b and 616c are similar to corresponding dummy gate layout patterns 140a, 140b and 140c, dummy gate layout patterns 622a, 622b and 622c are similar to corresponding dummy gate layout patterns 140a, 140b and 140c, and detailed description is therefore omitted.

Dummy gate layout patterns 620a, 620b and 620c are similar to corresponding dummy gate layout patterns 142a, 142b and 142c, dummy gate layout patterns 624a, 624b and 624c are similar to corresponding dummy gate layout patterns 142a, 142b and 142c, and detailed description is therefore omitted.

In comparison with layout design 100 of FIG. 1, gate layout pattern 617 of cell 604a replaces the first gate layout pattern 114 of FIG. 1.

In comparison with layout design 400 of FIG. 4, gate layout pattern 614a of cell 603a replaces the first gate layout pattern 114, gate layout pattern 614b of cell 603b replaces the first gate layout pattern 114, gate layout pattern 614c of cell 603c replaces the first gate layout pattern 114, rail layout pattern 618b of cell 603a replaces the second rail layout pattern 118b of FIG. 4, and rail layout pattern 618a of cell 603c replaces the first rail layout pattern 118a of FIG. 4.

Gate layout patterns 614a, 614b and 614c are similar to first gate layout pattern 114a, rail layout pattern 618a is similar to first rail layout pattern 118a, rail layout pattern 618b is similar to second rail layout pattern 118b, and detailed description is therefore omitted.

Gate layout pattern 614a is discontinuous from gate layout pattern 614b.

Gate layout pattern 614b is discontinuous from gate layout pattern 614c.

In some embodiments, a center 120a of the first active region layout pattern 104a of cell 602a or 604a is aligned with a side of cell 603a or 603b in the first direction X. In some embodiments, a center 122a of the second active region layout pattern 106a of cell 602a or 604a is aligned with a side of cell 603b or 603c in the first direction X.

In some embodiments, the first rail layout pattern 118a overlaps a side of cell 603a or 603b, and center 120a of the first active region layout pattern 104a of cell 602a or 604a. In some embodiments, the second rail layout pattern 118b overlaps a side of cell 603b or 603c, and center 122a of the second active region layout pattern 106a of cell 602a or 604a.

In some embodiments, the rail layout pattern 618a overlaps a side of cell 603c. In some embodiments, the rail layout pattern 618b overlaps a side of cell 603a. In some embodiments, the first active region layout pattern 104a and the second active region layout pattern 106a have a larger area than other approaches. As the area of the first active region layout pattern 106a and second active area layout pattern 106a is increased, the corresponding active region (first active region 204a and second active region 206a) of IC structure 200 manufactured by layout design 100 or 600B is increased, resulting in a layout design 100 or 600B and a corresponding IC structure (e.g., IC structure 200) with increased speed performance and power performance compared to other approaches.

Figure 7A:
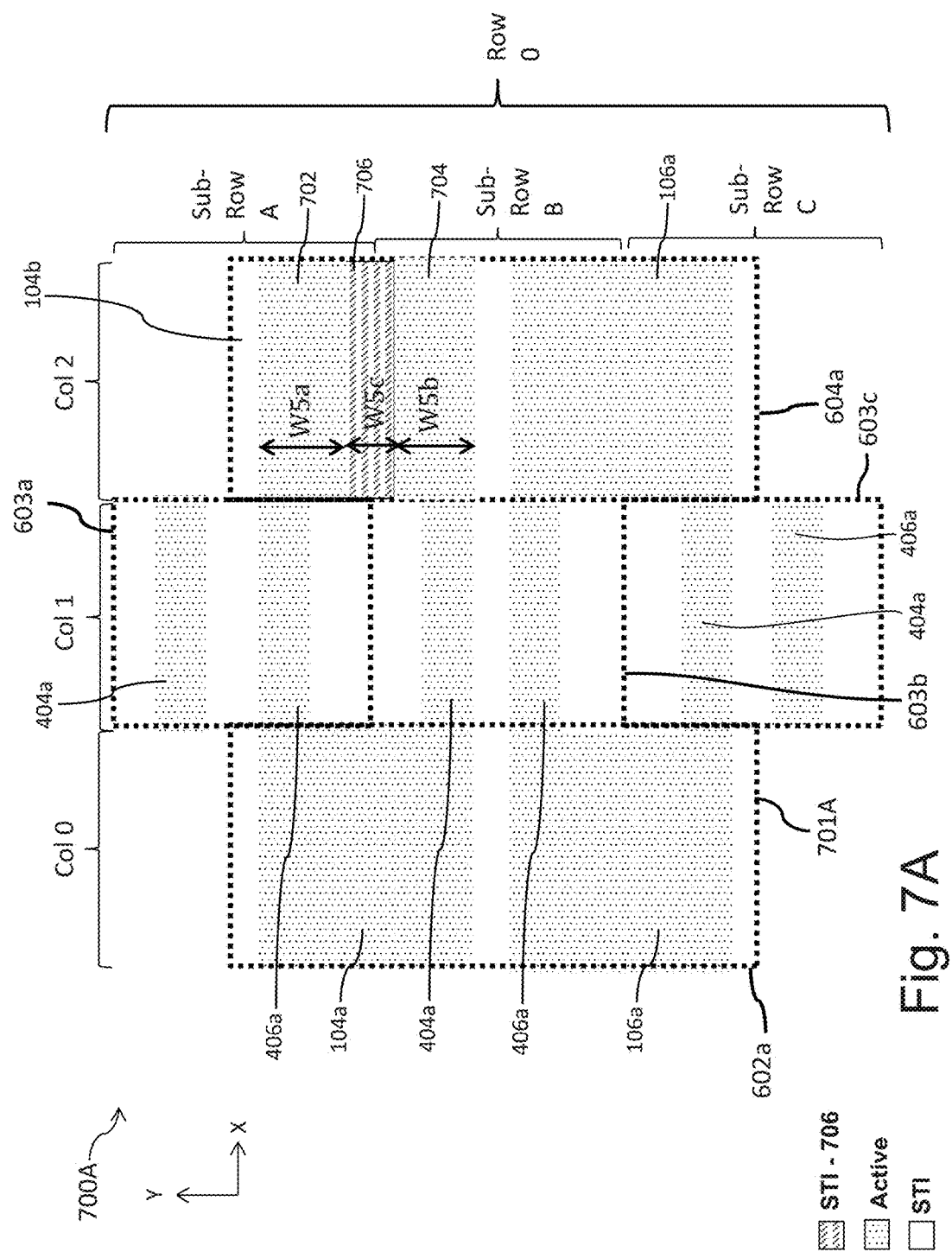
FIG. 7A is a diagram of a layout design of a portion of an IC structure, in accordance with some embodiments.

FIG. 7A is a diagram of a layout design 700A of a portion of an IC structure, in accordance with some embodiments.

For ease of illustration, gate layout patterns (e.g., first gate layout pattern 114, gate layout patterns 614a-614c, and 617) of FIG. 6B, rail layout patterns (e.g., first rail layout pattern 118a, second rail layout pattern 118b, rail layout patterns 618a-618b) of FIG. 6B, and dummy gate layout patterns 616a-616c, 620a-620c, 622a-622c, 624a-624c of FIG. 6B, are not shown in FIGS. 7A-7D.

Layout design 700A is a variation of layout design 600B. In comparison with layout design 600B, an active region layout pattern 702, an active region layout pattern 704 and an STI layout pattern 706 of layout design 700A replace the first active region layout pattern 104a of cell 604a of FIG. 6B.

Active region layout pattern 702 and 704 are similar to first active region layout pattern 104a, STI layout pattern 706 is similar to STI layout pattern 104b, and similar detailed description of the layout patterns is therefore omitted.

Active region layout pattern 702 extends in the first direction X, has a width W5a in the second direction Y.

Active region layout pattern 704 extends in the first direction X, has a width W5b in the second direction Y.

STI layout pattern 706 extends in the first direction X, and has a width W5c in the second direction Y. STI layout pattern 706 is between active region layout pattern 704 and active region layout pattern 702.

In some embodiments, first active region layout pattern 104a of cell 602a, second active region layout pattern 406a of cell 603a, first active region layout pattern 404a of cell 603b, active region layout pattern 702, and active region layout pattern 704 form an active region layout pattern having an C-shape. Different configurations of layout designs or cells is within the contemplated scope of the present disclosure.

Figure 7B:
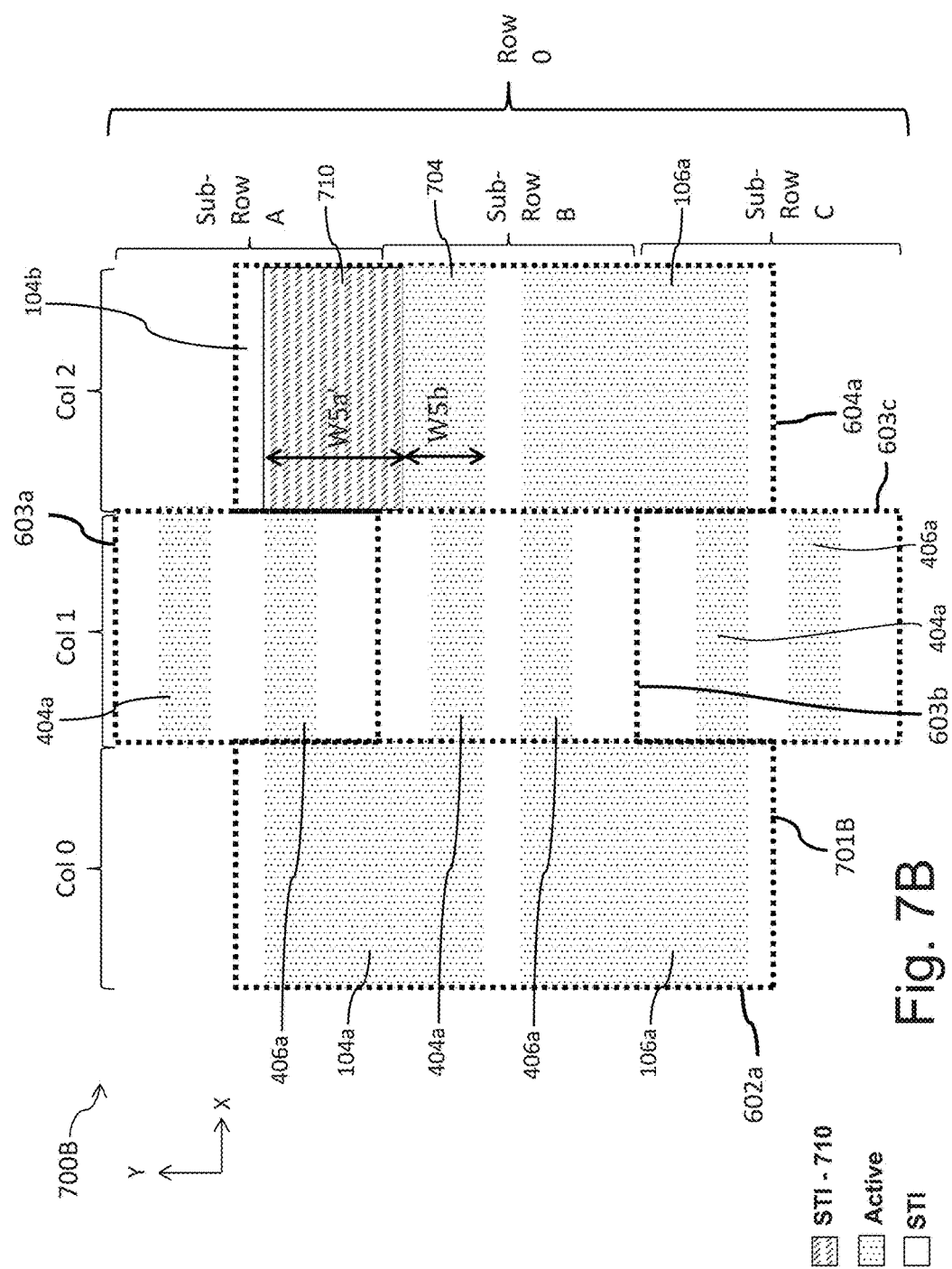
FIG. 7B is a diagram of a layout design of a portion of an IC structure, in accordance with some embodiments.

FIG. 7B is a diagram of a layout design 700B of a portion of an IC structure, in accordance with some embodiments.

Layout design 700B is a variation of layout design 600B. In comparison with layout design 600B, active region layout pattern 704 and an STI layout pattern 710 of layout design 700B replace the first active region layout pattern 104a of cell 604a of FIG. 6B.

Active region layout pattern 704 is similar to first active region layout pattern 104a, STI layout pattern 710 is similar to STI layout pattern 104b, and similar detailed description of the layout patterns is therefore omitted.

STI layout pattern 710 extends in the first direction X, and has a width W5a' in the second direction Y. STI layout pattern 710 is between active region layout pattern 704 and STI layout pattern 104b of cell 604a.

In some embodiments, first active region layout pattern 104a of cell 602a, second active region layout pattern 406a of cell 603a, first active region layout pattern 404a of cell 603b and active region layout pattern 704 form an active region layout pattern having an G-shape. Different configurations of layout designs or cells is within the contemplated scope of the present disclosure.

Figure 7C:
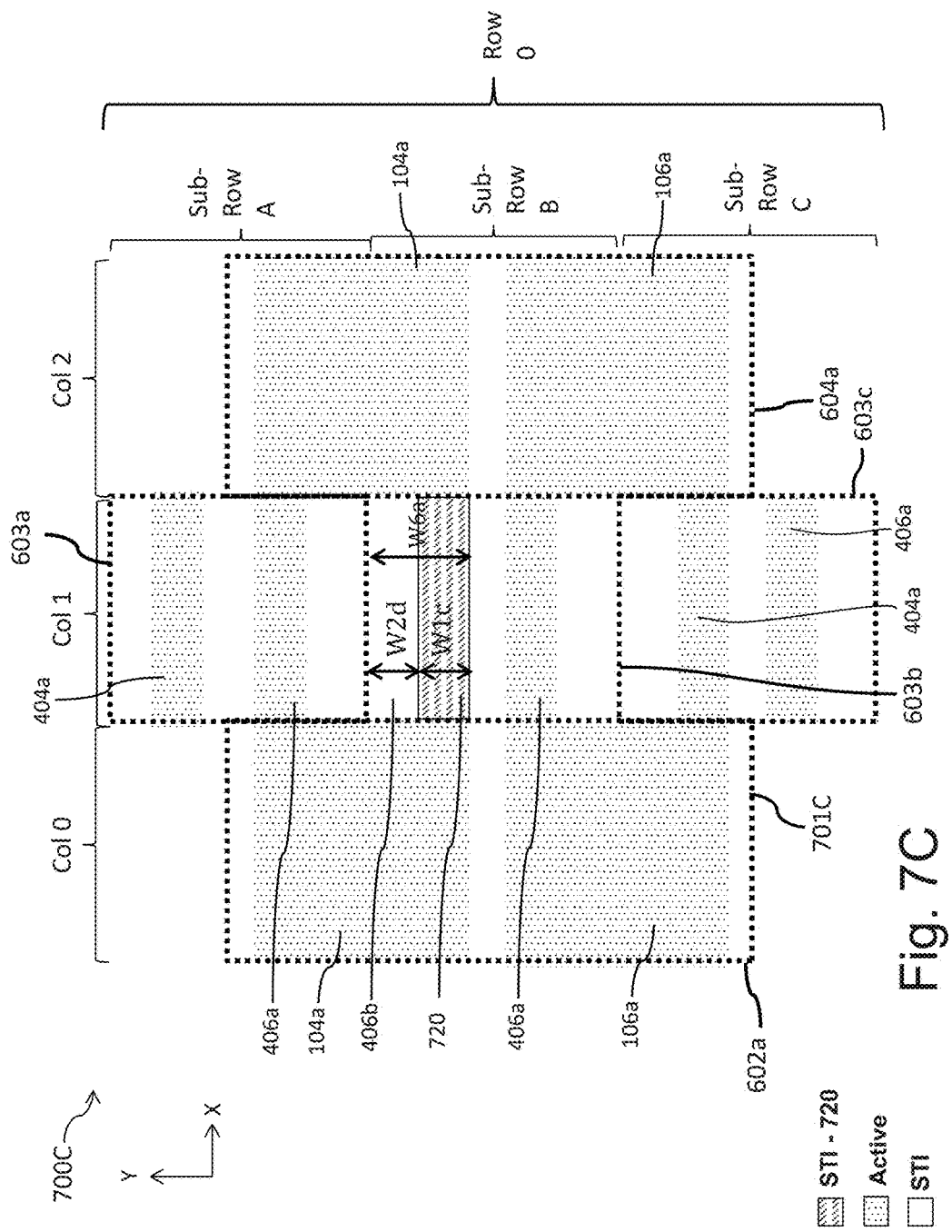
FIG. 7C is a diagram of a layout design of a portion of an IC structure, in accordance with some embodiments.

FIG. 7C is a diagram of a layout design 700C of a portion of an IC structure, in accordance with some embodiments.

Layout design 700C is a variation of layout design 600B. In comparison with layout design 600B, an STI layout pattern 720 of layout design 700C replaces the first active region layout pattern 404a of cell 603b of FIG. 6B.

STI layout pattern 720 is similar to STI layout pattern 406b, and similar detailed description of the layout patterns is therefore omitted.

STI layout pattern 720 extends in the first direction X, and has a width W1c in the second direction Y. STI layout pattern 720 is between STI layout pattern 102a of cell 603b and STI layout pattern 406b of cell 603b. The width W1c of STI layout pattern 720 and the width W2d of STI layout pattern 406b together have a width W6a in the second direction Y.

In some embodiments, first active region layout pattern 104a of cell 602a, second active region layout pattern 406a of cell 603a, and first active region layout pattern 104a of cell 604a form an active region layout pattern having an N-shape. Different configurations of layout designs or cells is within the contemplated scope of the present disclosure.

Figure 7D:
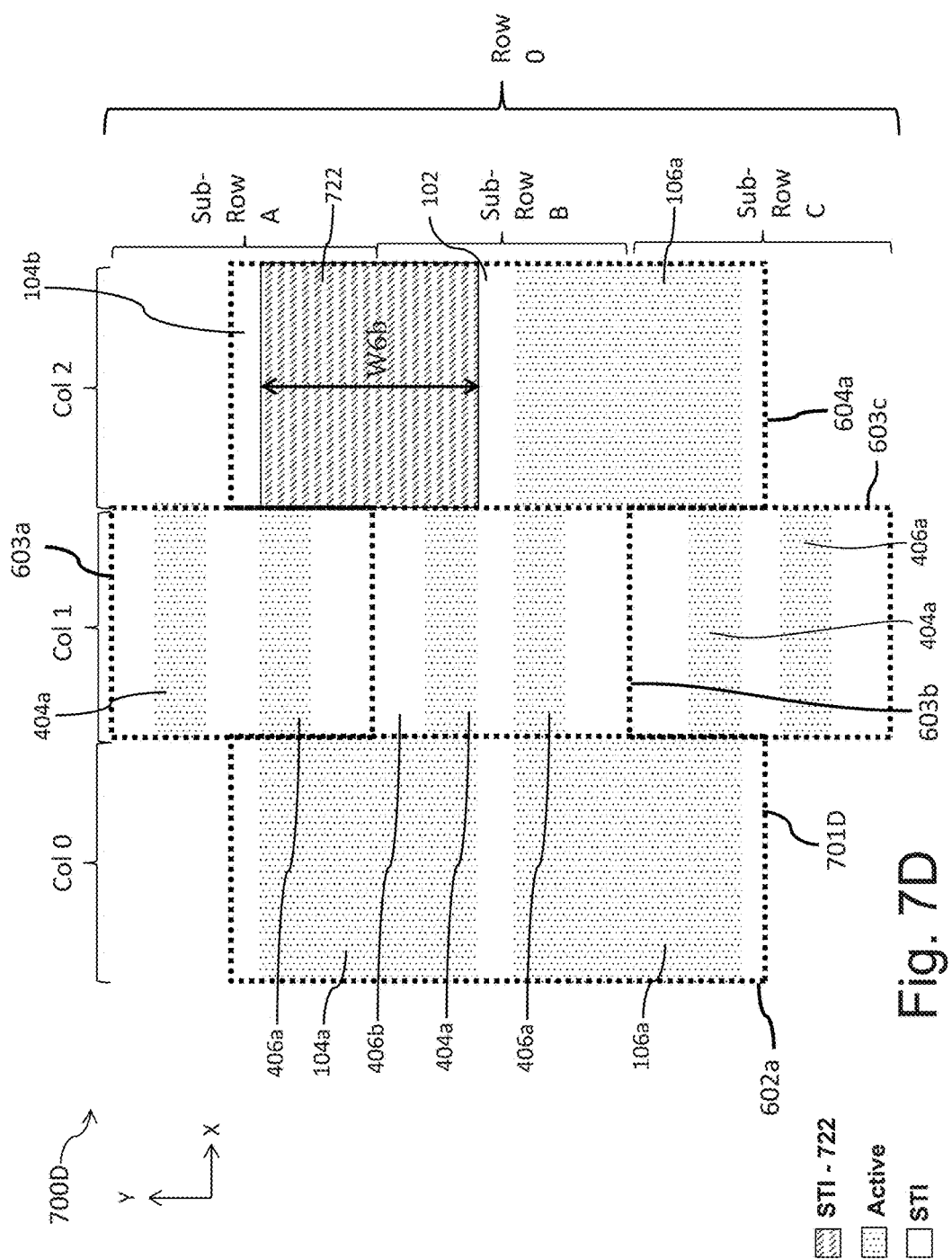
FIG. 7D is a diagram of a layout design of a portion of an IC structure, in accordance with some embodiments.

FIG. 7D is a diagram of a layout design 700D of a portion of an IC structure, in accordance with some embodiments.

Layout design 700D is a variation of layout design 600B. In comparison with layout design 600B, an STI layout pattern 722 of layout design 700D replaces the first active region layout pattern 104a of cell 604a of FIG. 6B.

STI layout pattern 722 is similar to STI layout pattern 104b, and similar detailed description of the layout patterns is therefore omitted.

STI layout pattern 722 extends in the first direction X, and has a width W6b in the second direction Y. STI layout pattern 722 is between STI layout pattern 102a of cell 604a and STI layout pattern 104b of cell 604a.

In some embodiments, first active region layout pattern 104a of cell 602a, second active region layout pattern 406a of cell 603a and first active region layout pattern 404a of cell 603b form an active region layout pattern having another C-shape. Different configurations of layout designs or cells is within the contemplated scope of the present disclosure.

In some embodiments, a width of widths W1, W1a, W1a', W1b, W1b', W1c, W1d, W2a, W2a', W2b, W2b', W2c, W2c', W2d, W2d', W4a, W4b, W5a, W5a', W5b, W5c, W6a, or W6b is the same as a different width of widths W1, W1a, W1a', W1b, W1b', W1c, W1d, W2a, W2a', W2b, W2b', W2c, W2c', W2d, W2d', W4a, W4b, W5a, W5a', W5b, W5c, W6a, or W6b. In some embodiments, a width of widths W1, W1a, W1a', W1b, W1b', W1c, W1d, W2a, W2a', W2b, W2b', W2c, W2c', W2d, W2d', W4a, W4b, W5a, W5a', W5b, W5c, W6a, or W6b differs from a different width of widths W1, W1a, W1a', W1b, W1b', W1c, W1d, W2a, W2a', W2b, W2b', W2c, W2c', W2d, W2d', W4a, W4b, W5a, W5a', W5b, W5c, W6a, or W6b.

Figure 8:
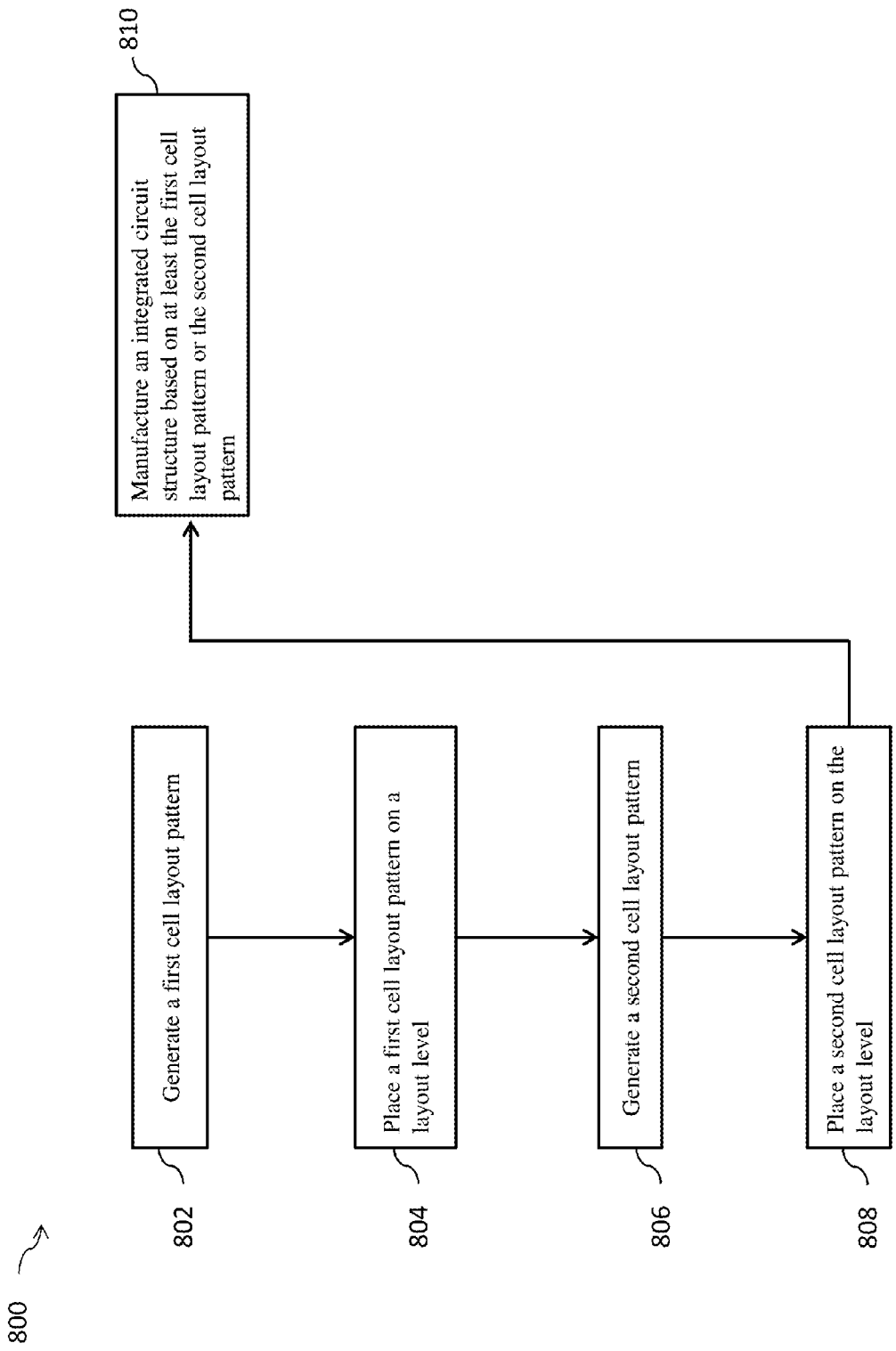
FIG. 8 is a flowchart of a method of forming an IC structure, in accordance with some embodiments.

FIG. 8 is a flowchart of a method 800 of forming or manufacturing an IC in accordance with some embodiments. It is understood that additional operations may be performed before, during, and/or after the method 800 depicted in FIG. 8, and that some other processes may only be briefly described herein. In some embodiments, the method 800 is usable to form integrated circuits, such as IC structure 200 or 500 (FIG. 2A-2C or 5A-5B). In some embodiments, the method 800 is usable to form integrated circuits having similar structural relationships as one or more of layout designs 100, 300A-300C, 400, 600A-600B, 700A-700D (FIG. 1, 3A-3C, 4, 6A-6B or 7A-7D).

In operation 802 of method 800, a first cell layout pattern is generated. The first cell layout pattern corresponds to fabricating a standard cell 201 of IC structure 200. In some embodiments, the first cell layout pattern of method 800 includes one or more of layout designs 100, 300A-300C, 600A-600B and 700A-700C. In some embodiments, the first cell layout pattern of method 800 includes one or more of cells 602a or 604a shown in FIGS. 6A-6B and 7A-7D.

In operation 804, the first cell layout pattern is placed on a layout level. In some embodiments, the first cell layout pattern of method 800 is placed similar to the orientation of cells 602a or 604a shown in layout design 600A-600B and 700A-700C. In some embodiments, the first cell layout pattern of method 800 is placed in cells 602a or 604a as shown in FIGS. 6A-6B and 7A-7D. Other configurations of cells or levels are within the scope of the present disclosure.

In operation 806, a second cell layout pattern is generated. The second cell layout pattern corresponds to fabricating a standard cell 501 of IC structure 500. In some embodiments, the second cell layout pattern of method 800 includes one or more of layout designs 400, 600A-600B and 700A-700C. In some embodiments, the second cell layout pattern of method 800 includes one or more of cells 603a, 603b, 603c, 605a, 605b or 605c shown in FIGS. 6A-6B and 7A-7D.

In operation 808, a second cell layout pattern is placed on the layout level. In some embodiments, the second cell layout pattern is placed adjacent to the first cell layout pattern. In some embodiments, the second cell layout pattern of method 800 is placed similar to the orientation of cells 603a, 603b, 603c, 605a, 605b or 605c shown in layout designs 600A-600B and 700A-700C. In some embodiments, the second cell layout pattern of method 800 is placed in cells 603a, 603b, 603c, 605a, 605b or 605c shown in FIGS. 6A-6B and 7A-7D. Other configurations of cells or levels are within the scope of the present disclosure.

In operation 810, IC structure 200 or 500 is manufactured based on at least the first cell layout pattern or the second cell layout pattern. In some embodiments, operation 808 includes one or more operations to manufacture a set of masks based on one or more layout patterns (e.g., the first cell layout pattern or the second cell layout pattern) of method 800 or method 900A-900B. In these embodiments, method 800 further includes one or more operations to manufacture IC structure 200 or 500 using the set of masks.

One or more of operations 802, 804, 806 or 808 is performed by a processing device (e.g., system 1000 of FIG. 10) configured to execute instructions for manufacturing an IC, such as IC structure 200 or 500. In some embodiments, one or more of operations 802, 804, 806 or 808 is performed using a same processing device as that used in a different one or more of operations 802, 804, 806 or 808. In some embodiments, a different processing device is used to perform one or more of operations 802, 804, 806 or 808 from that used to perform a different one or more of operations 802, 804, 806 or 808. In some embodiments, one or more of operations 802, 804, 806 or 808 is optional.

Figure 9A:
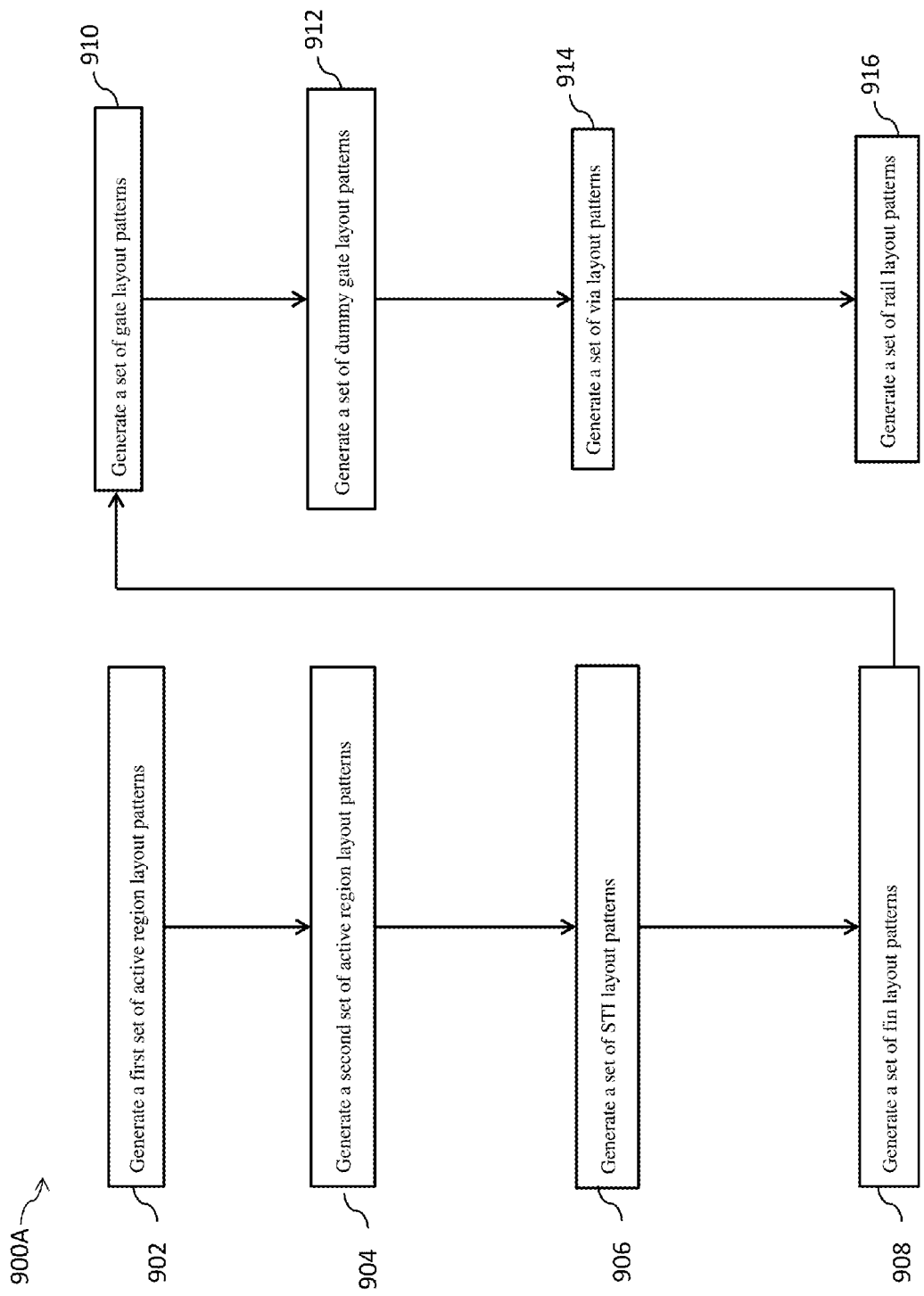
FIG. 9A is a flowchart of a method of generating a cell layout pattern of an IC, in accordance with some embodiments.

FIG. 9A is a flowchart of a method 900A of generating a cell layout pattern of an IC in accordance with some embodiments. It is understood that additional operations may be performed before, during, and/or after the method 900A depicted in FIG. 9A, and that some other processes may only be briefly described herein. In some embodiments, the method 900A is usable to generate layout designs 100, 300A-300C, 400, 600A-600B or 700A-700D (FIG. 1, 3A-3C, 4, 6A-6B or 7A-7D) of integrated circuits, such as IC structure 200 or 500 (FIG. 2A-2C or 5A-5B). In some embodiments, method 900A is usable to generate layout designs of integrated circuits having similar structural relationships as one or more of layout designs 100, 300A-300C, 400, 600A-600B or 700A-700D (FIG. 1, 3A-3C, 4, 6A-6B or 7A-7D).

Method 900A is an embodiment of operation 802 or operation 806 of FIG. 8 with similar elements. In some embodiments, operation 802 generates a first cell layout pattern similar to layout pattern 100 based on method 900A, and operation 806 generates a second cell layout pattern similar to layout design 400 based on method 900A. In some embodiments, method 900A is repeated to generate additional layout patterns similar to one or more of layout design 600A-600B or 700A-700D.

In operation 902 of method 900A, a first set of active region layout patterns is generated. In some embodiments, the first set of active region layout patterns of method 900A includes at least first active region layout pattern 104*a*, 304*a* or 404*a* or active region layout pattern 702 or 704, and detailed description of these layout patterns is therefore omitted.

In operation 904, a second set of active region layout patterns is generated. In some embodiments, the second set of active region layout patterns of method 900A includes at least second active region layout pattern 106*a*, 306*a* or 406*a*, or active region layout pattern 702 or 704, and detailed description of these layout patterns is therefore omitted.

In operation 906, a set of STI layout patterns is generated. In some embodiments, the STI layout patterns of method 900A includes at least STI layout patterns 102*a*, 104*b*, 106*b*, 304*b*, 306*b*, 404*b*, 406*b*, 706, 710, 720 or 722, and detailed description of these layout patterns is therefore omitted.

In operation 908, a set of fin layout patterns is generated. In some embodiments, the set of fin layout patterns of method 900A includes at least the first set of fin layout patterns 110, second set of fin layout patterns 112, the first set of fin layout patterns 410 or second set of fin layout patterns 412, and detailed description of these layout patterns is therefore omitted.

In operation 910, a set of gate layout patterns is generated. In some embodiments, the set of gate layout patterns of method 900A includes at least the first gate layout pattern 114, second gate layout pattern 314*a*, third gate layout pattern 314*b*, gate layout pattern 614*a*, gate layout pattern 614*b*, gate layout pattern 614*c* or gate layout pattern 617, and detailed description of these layout patterns is therefore omitted.

In operation 912, a set of dummy gate layout patterns is generated. In some embodiments, the set of dummy gate layout patterns of method 900A includes at least the first dummy gate layout pattern 116*a*, second dummy gate layout pattern 116*b*, dummy gate layout pattern 140*a*, dummy gate layout pattern 140*b*, dummy gate layout pattern 140*c*, dummy gate layout pattern 142*a*, dummy gate layout pattern 142*b*, dummy gate layout pattern 142*c*, dummy gate layout pattern 616*a*, dummy gate layout pattern 616*b*, dummy gate layout pattern 616*c*, dummy gate layout pattern 620*a*, dummy gate layout pattern 620*b*, dummy gate layout pattern 620*c*, dummy gate layout pattern 622*a*, dummy gate layout pattern 622*b*, dummy gate layout pattern 622*c*, dummy gate layout pattern 624*a*, dummy gate layout pattern 624*b* or dummy gate layout pattern 624*c*, and detailed description of these layout patterns is therefore omitted.

In operation 914, a set of via layout patterns is generated. In some embodiments, the set of via layout patterns of method 900A includes at least via layout pattern 132*a*, via layout pattern 132*b*, or via layout pattern 132*c*, and detailed description of these layout patterns is therefore omitted.

In operation 916, a set of rail layout patterns is generated. In some embodiments, the set of rail layout patterns of method 900A includes at least the first rail layout pattern 118*a*, second rail layout pattern 118*b*, rail layout pattern 618*a* or rail layout pattern 618*b*, and detailed description of these layout patterns is therefore omitted.

Figure 9B:
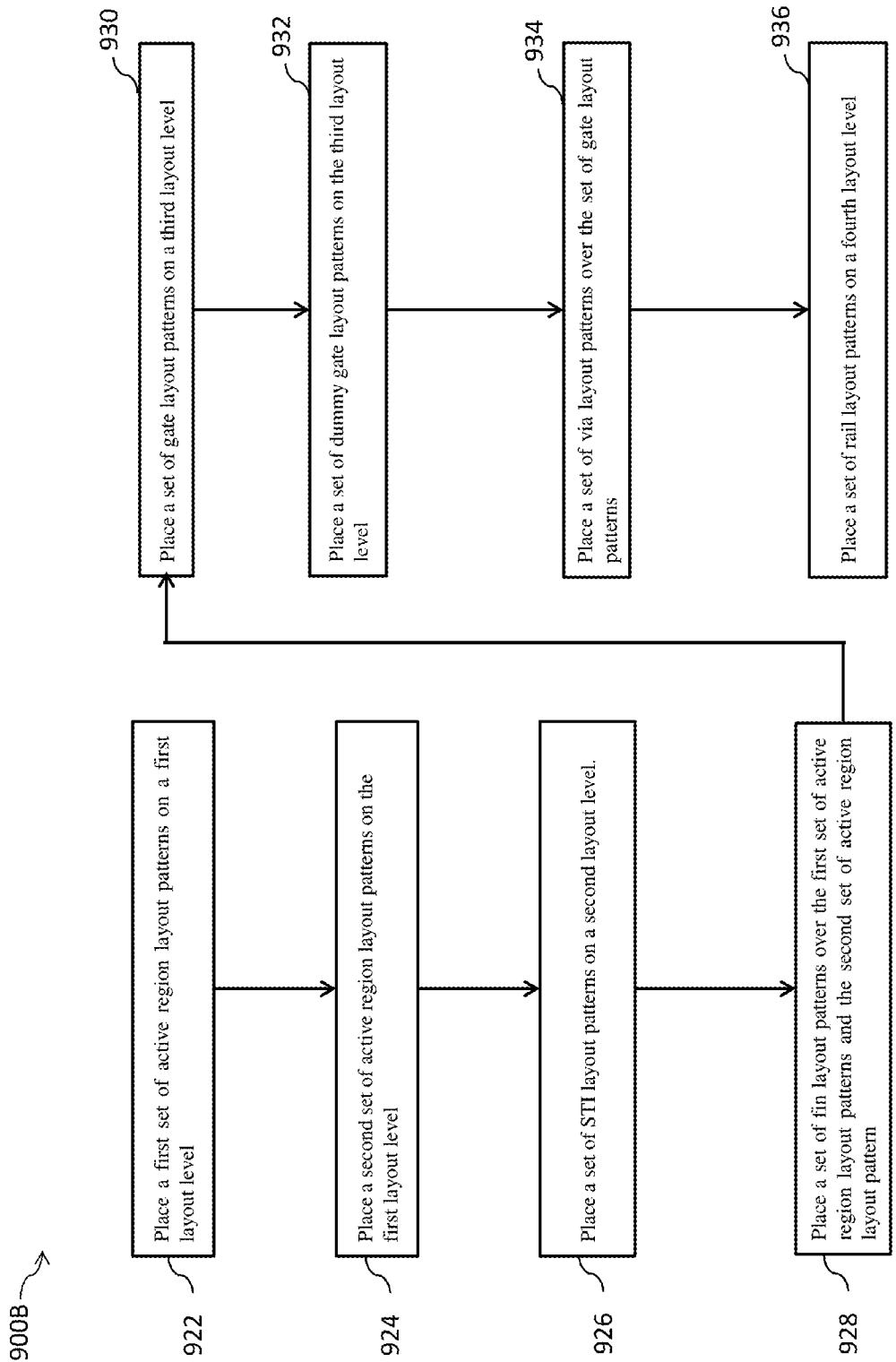
FIG. 9B is a flowchart of a method of placing a cell layout pattern of an IC, in accordance with some embodiments.

FIG. 9B is a flowchart of a method 900B of placing a cell layout pattern of an IC in accordance with some embodiments. It is understood that additional operations may be performed before, during, and/or after the method 900B depicted in FIG. 9B, and that some other processes may only be briefly described herein. In some embodiments, the method 900B is usable to place layout designs 100, 300A-300C, 400, 600A-600B or 700A-700D (FIG. 1, 3A-3C, 4, 6A-6B or 7A-7D) of integrated circuits, such as IC structure 200 or 500 (FIG. 2A-2C or 5A-5B). In some embodiments, method 900B is usable to place layout designs of integrated circuits having similar structural relationships as one or more of layout designs 100, 300A-300C, 400, 600A-600B or 700A-700D (FIG. 1, 3A-3C, 4, 6A-6B or 7A-7D).

Method 900B is an embodiment of operation 804 or operation 808 of FIG. 8 with similar elements. In some embodiments, operation 804 places a first cell layout pattern similar to layout pattern 100 based on method 900B, and operation 808 places a second cell layout pattern similar to layout design 400 based on method 900B. In some embodiments, method 900B is repeated to place additional layout patterns similar to one or more of layout design 600A-600B or 700A-700D.

In operation 922, the first set of active region layout patterns is placed on a first layout level. In some embodiments, the first set of active region layout patterns of method 900B includes at least first active region layout patterns 104*a*, 304*a* or 404*a*, or active region layout pattern 702 or 704, and detailed description of these layout patterns is therefore omitted.

In operation 924, the second set of active region layout patterns is placed on the first layout level. In some embodiments, the second set of active region layout patterns of method 900B includes at least second active region layout patterns 106a, 306a or 406a, or active region layout pattern 702 or 704, and detailed description of these layout patterns is therefore omitted.

In operation 926, the set of STI layout patterns is placed on a second layout level. In some embodiments, at least one member of the set of STI layout patterns is placed between the first active region layout pattern and the second active region layout pattern. In some embodiments, the STI layout patterns of method 900B includes at least STI layout patterns 102a, 104b, 106b, 304b, 306b, 404b, 406b, 706, 710, 720 or 722, and detailed description of these layout patterns is therefore omitted.

In operation 928, the set of fin layout patterns is placed over the first set of active region layout patterns and the second set of active region layout pattern. In some embodiments, the set of fin layout patterns of method 900B includes at least the first set of fin layout patterns 110, second set of fin layout patterns 112, the first set of fin layout patterns 410 or second set of fin layout patterns 412, and detailed description of these layout patterns is therefore omitted.

In operation 930, the set of gate layout patterns is placed on a third layout level. In some embodiments, the set of gate layout patterns of method 900B includes at least the first gate layout pattern 114, second gate layout pattern 314a, third gate layout pattern 314b, gate layout pattern 614a, gate layout pattern 614b, gate layout pattern 614c or gate layout pattern 617, and detailed description of these layout patterns is therefore omitted.

In operation 932, the set of dummy gate layout patterns is placed on the third layout level. In some embodiments, the set of dummy gate layout patterns of method 900B includes at least the first dummy gate layout pattern 116a, second dummy gate layout pattern 116b, dummy gate layout pattern 140a, dummy gate layout pattern 140b, dummy gate layout pattern 140c, dummy gate layout pattern 142a, dummy gate layout pattern 142b, dummy gate layout pattern 142c, dummy gate layout pattern 616a, dummy gate layout pattern 616b, dummy gate layout pattern 616c, dummy gate layout pattern 620a, dummy gate layout pattern 620b, dummy gate layout pattern 620c, dummy gate layout pattern 622a, dummy gate layout pattern 622b, dummy gate layout pattern 622c, dummy gate layout pattern 624a, dummy gate layout pattern 624b or dummy gate layout pattern 624c, and detailed description of these layout patterns is therefore omitted.

In operation 934, the set of via layout patterns is placed over the set of gate layout patterns. In some embodiments, the set of via layout patterns of method 900A includes at least via layout pattern 132a, via layout pattern 132b, or via layout pattern 132c, and detailed description of these layout patterns is therefore omitted.

In operation 936, the set of rail layout patterns is placed on a fourth layout level. In some embodiments, the set of rail layout patterns of method 900A includes at least the first rail layout pattern 118a, second rail layout pattern 118b, rail layout pattern 618a or rail layout pattern 618b, and detailed description of these layout patterns is therefore omitted.

One or more of operations 902, 904, 906, 908, 910, 912, 914, 916, 922, 924, 926, 928, 930, 932, 934 or 936 is performed by a processing device (e.g., system 1000 of FIG. 10) configured to execute instructions for manufacturing an IC, such as IC structure 200 or 500. In some embodiments, one or more of operations 902, 904, 906, 908, 910, 912, 914, 916, 922, 924, 926, 928, 930, 932, 934 or 936 is performed using a same processing device as that used in a different one or more of operations 902, 904, 906, 908, 910, 912, 914, 916, 922, 924, 926, 928, 930, 932, 934 or 936. In some embodiments, a different processing device is used to perform one or more of operations 902, 904, 906, 908, 910, 912, 914, 916, 922, 924, 926, 928, 930, 932, 934 or 936 from that used to perform a different one or more of operations 902, 904, 906, 908, 910, 912, 914, 916, 922, 924, 926, 928, 930, 932, 934 or 936. In some embodiments, one or more of operations 902, 904, 906, 908, 910, 912, 914, 916, 922, 924, 926, 928, 930, 932, 934 or 936 is optional.

Figure 10:
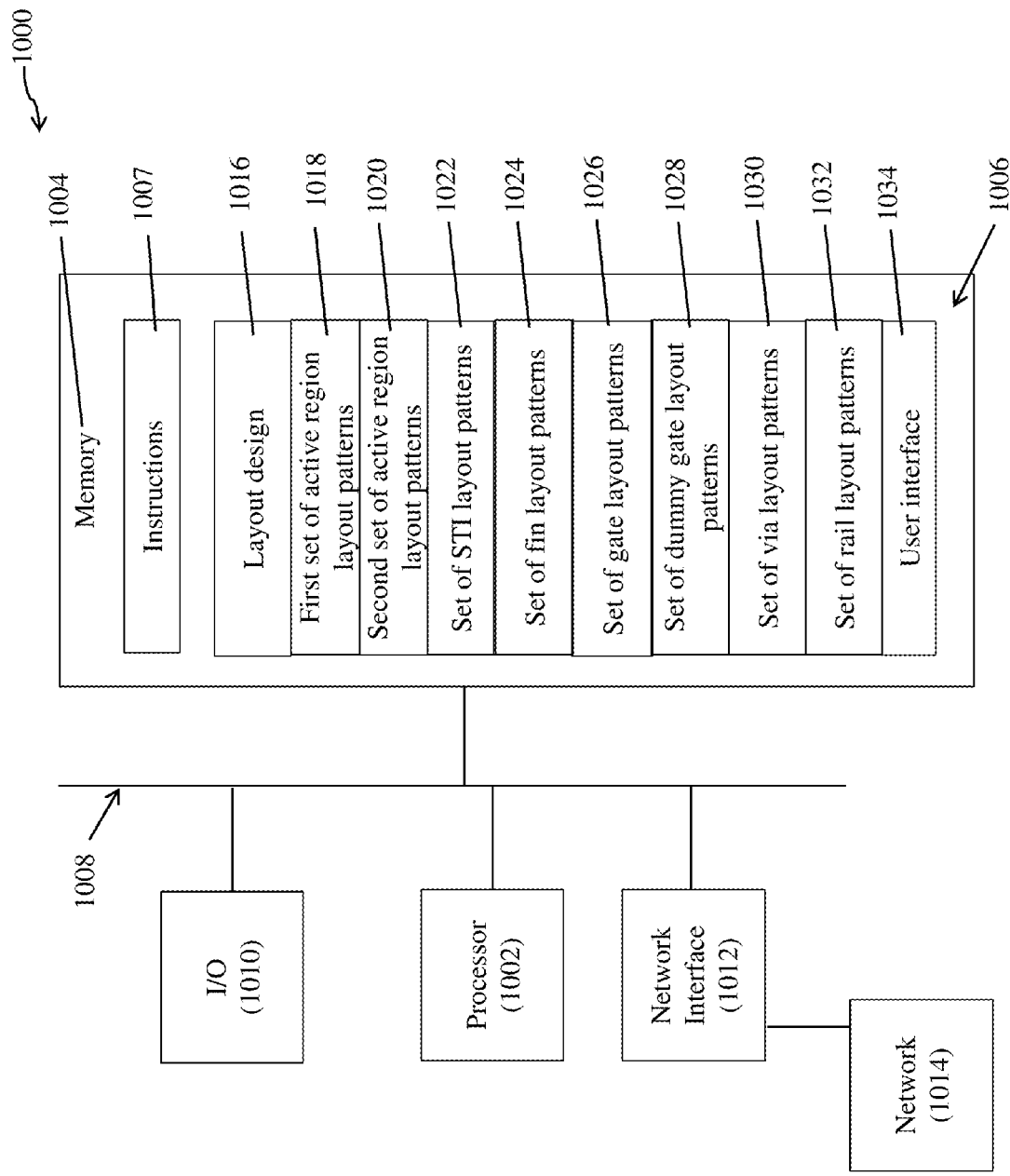
FIG. 10 is a block diagram of a system of designing an IC layout design, in accordance with some embodiments.

FIG. 10 is a schematic view of a system 1000 for designing an IC layout design in accordance with some embodiments. System 1000 includes a hardware processor 1002 (hereinafter "processor 1002") and a non-transitory, computer readable storage medium 1004 (hereinafter "computer readable storage medium 1004") encoded with, i.e., storing, the computer program code 1006, i.e., a set of executable instructions. Computer readable storage medium 1004 is also encoded with instructions 1007 for interfacing with manufacturing machines for producing the integrated circuit. The processor 1002 is electrically coupled to the computer readable storage medium 1004 via a bus 1008. The processor 1002 is also electrically coupled to an I/O interface 1010 by bus 1008. A network interface 1012 is also electrically connected to the processor 1002 via bus 1008. Network interface 1012 is connected to a network 1014, so that processor 1002 and computer readable storage medium 1004 are capable of connecting to external elements via network 1014. The processor 1002 is configured to execute the computer program code 1006 encoded in the computer readable storage medium 1004 in order to cause system 1000 to be usable for performing a portion or all of the operations as described in method 800, 900A or 900B.

In some embodiments, the processor 1002 is a central processing unit (CPU), a multi-processor, a distributed processing system, an application specific integrated circuit (ASIC), and/or a suitable processing unit.

In some embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1004 includes a compact disk-read only memory (CD-ROM), a compact disk-read/write (CD-R/W), and/or a digital video disc (DVD).

In some embodiments, the computer readable storage medium 1004 stores the computer program code 1006 configured to cause system 1000 to perform method 800, 900A or 900B. In some embodiments, the computer readable storage medium 1004 also stores information needed for performing method 800, 900A or 900B as well as information generated during performing method 800, 900A or 900B, such as layout design 1016, first set of active region layout patterns 1018, second set of active region layout patterns 1020, set of STI layout patterns 1022, set of fin layout patterns 1024, set of gate layout patterns 1026, set of dummy gate layout patterns 1028, set of via layout patterns 1030, set of rail layout patterns 1032 and user interface 1034, and/or a set of executable instructions to perform the operation of method 800, 900A or 900B.

In some embodiments, the computer readable storage medium 1004 stores instructions 1007 for interfacing with manufacturing machines. The instructions 1007 enable processor 1002 to generate manufacturing instructions readable by the manufacturing machines to effectively implement method 800, 900A or 900B during a manufacturing process.

System 1000 includes I/O interface 1010. I/O interface 1010 is coupled to external circuitry. In some embodiments, I/O interface 1010 includes a keyboard, keypad, mouse, trackball, trackpad, and/or cursor direction keys for communicating information and commands to processor 1002.

System 1000 also includes network interface 1012 coupled to the processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interface such as ETHERNET, USB, or IEEE-1394. In some embodiments, method 800, 900A or 900B is implemented in two or more systems 1000, and information such as layout design, first set of active region layout patterns, second set of active region layout patterns, set of STI layout patterns, set of fin layout patterns, set of gate layout patterns, set of dummy gate layout patterns, set of via layout patterns, set of rail layout patterns and user interface are exchanged between different systems 1000 by network 1014.

System 1000 is configured to receive information related to a layout design through I/O interface 1010 or network interface 1012. The information is transferred to processor 1002 by bus 1008 to determine a layout design for producing IC structure 200 or 500. The layout design is then stored in computer readable medium 1004 as layout design 1016. System 1000 is configured to receive information related to a first set of active region layout patterns through I/O interface 1010 or network interface 1012. The information is stored in computer readable medium 1004 as first set of active region layout patterns 1018. System 1000 is configured to receive information related to a second set of active region layout patterns through I/O interface 1010 or network interface 1012. The information is stored in computer readable medium 1004 as second set of active region layout patterns 1020. System 1000 is configured to receive information related to a set of STI layout patterns through I/O interface 1010 or network interface 1012. The information is stored in computer readable medium 1004 as set of STI layout patterns 1022. System 1000 is configured to receive information related to a set of fin layout patterns through I/O interface 1010 or network interface 1012. The information is stored in computer medium 1004 as set of fin layout patterns 1024. System 1000 is configured to receive information related to a set of gate layout patterns through I/O interface 1010 or network interface 1012. The information is stored in computer readable medium 1004 as set of gate layout patterns 1026. System 1000 is configured to receive information related to a set of dummy gate layout patterns through I/O interface 1010 or network interface 1012. The information is stored in computer readable medium 1004 as set of dummy gate layout patterns 1028. System 1000 is configured to receive information related to a set of via layout patterns through I/O interface 1010 or network interface 1012. The information is stored in computer readable medium 1004 as set of via layout patterns 1030. System 1000 is configured to receive information related to a set of rail layout patterns through I/O interface 1010 or network interface 1012. The information is stored in computer readable medium 1004 as set of rail layout patterns 1032. System 1000 is configured to receive information related to a user interface through I/O interface 1010 or network interface 1012. The information is stored in computer readable medium 1004 as user interface 1034.

In some embodiments, portions of method 800, 900A or 900B is implemented as a standalone software application for execution by a processor. In some embodiments, portions of method 800, 900A or 900B is implemented as a software application that is a part of an additional software application. In some embodiments, portions of method 800, 900A or 900B is implemented as a plug-in to a software application. In some embodiments, portions of method 800, 900A or 900B is implemented as a software application that is a portion of an EDA tool. In some embodiments, portions of method 800, 900A or 900B is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 800, 900A or 900B is implemented by a manufacturing device configured to manufacture an integrated circuit (e.g., IC structure 200 or 500) using a set of masks manufactured based on one or more layout designs (e.g., layout design 100, 300A, 300B, 300C, 400, 600A, 600B, 700A, 700B, 700C or 700D) generated by system 1000.

System 1000 of FIG. 10 generates layout designs (e.g., layout design 100, 300A, 300B, 300C, 400, 600A, 600B, 700A, 700B, 700C or 700D) of IC structure 200 or 500 that occupy less area and provide better routing resources than other approaches.

One aspect of this description relates to an integrated circuit structure. The integrated circuit structure comprising a first cell, a first rail and a second rail. The first cell comprising a first active region, a second active region and a first gate structure. The first active region extends in a first direction and is located at a first level. The second active region extends in the first direction, is located at the first level, and is separated from the first active region in a second direction different from the first direction. The first gate structure extends in the second direction, overlaps the first active region and the second active region, and is located at a second level different from the first level. The first rail extends in the first direction, overlaps the first active region, is configured to supply a first supply voltage, and is located at a third level different from the first level and the second level. The second rail extends in the first direction, overlaps the second active region, is located at the third level, is separated from the first rail in the second direction, and is configured to supply a second supply voltage different from the first supply voltage.

Another aspect of this description relates to a method of forming an integrated circuit structure. The method including placing a first cell layout pattern on a layout level, the first cell layout pattern corresponding to fabricating a first cell of an integrated circuit structure, the first cell layout pattern comprising a first side and a second side on an opposite side of the first cell from the first side. The placing the first cell layout pattern comprising placing a first active region layout pattern on a first layout level, the first active region layout pattern corresponding to fabricating a first active region of the integrated circuit structure, the first active region layout pattern extending in a first direction. The placing the first cell layout pattern further comprising placing a second active region layout pattern on the first layout level, the second active region layout pattern corresponding to fabricating a second active region of the integrated circuit structure, the second active region layout pattern extending in the first direction and being separated from the first active region layout pattern in a second direction different from the first direction. The placing the first cell layout pattern further comprising placing a first gate layout pattern on a second layout level different from the first layout level, the first gate layout pattern corresponding to fabricating a first gate structure of the integrated circuit structure, the first gate layout pattern extending in the second direction, and overlapping the first active region layout pattern and the second active region layout pattern. The method further comprising placing a first rail layout pattern on a third layout level different from the first layout level and the second layout level, the first rail layout pattern corresponding to fabricating a first rail of the integrated circuit structure, the first rail being configured to supply a first supply voltage, the first rail layout pattern extending in the first direction and overlapping the first active region layout pattern. The method further comprising placing a second rail layout pattern on the third layout level, the second rail layout pattern corresponding to fabricating a second rail of the integrated circuit structure, the second rail being configured to supply a second supply voltage different from the first supply voltage, the second rail layout pattern extending in the first direction, and being separated from the first rail layout pattern in the second direction, the second rail layout pattern not overlapping a first side or a second side of the first cell layout pattern, wherein at least one of the above layout patterns is stored on a non-transitory computer-readable medium, and at least one of the above operations is performed by a hardware processor. The method further comprising manufacturing the integrated circuit structure based on at least one of the above layout patterns of the integrated circuit.

Still another aspect of this description relates to a method of forming an integrated circuit structure. The method including generating a first cell layout pattern corresponding to fabricating a first cell of an integrated circuit structure. The generating the first cell layout pattern comprising generating a first active region layout pattern corresponding to fabricating a first active region of the integrated circuit structure, the first active region layout pattern extending in a first direction and being located at a first layout level. The generating the first cell layout pattern further comprising generating a second active region layout pattern corresponding to fabricating a second active region of the integrated circuit structure, the second active region layout pattern extending in the first direction, being located at the first layout level, and being separated from the first active region layout pattern in a second direction different from the first direction. The generating the first cell layout pattern further comprising generating a first gate layout pattern corresponding to fabricating a first gate structure of the integrated circuit structure, the first gate layout pattern extending in the second direction, overlapping the first active region layout pattern and the second active region layout pattern and being located at a second layout level different from the first layout level. The method further comprising generating a first rail layout pattern corresponding to fabricating a first rail of the integrated circuit structure, the first rail layout pattern extending in the first direction, overlapping the first active region layout pattern, and being located at a third layout level different from the first layout level and the second layout level, the first rail being configured to supply a first supply voltage. The method further comprising generating a second rail layout pattern corresponding to fabricating a second rail of the integrated circuit structure, the second rail layout pattern extending in the first direction, overlapping the second active region layout pattern, being located at the third layout level, being separated from the first rail layout pattern in the second direction, and the second rail being configured to supply a second supply voltage different from the first supply voltage, wherein at least one of the above layout patterns is stored on a non-transitory computer-readable medium, and at least one of the above operations is performed by a hardware processor. The method further comprising manufacturing the integrated circuit structure based on at least one of the above layout patterns of the integrated circuit.

Still another aspect of this description relates to an integrated circuit structure. The IC structure including a first cell comprising a first active region extending in a first direction and being located at a first level; a second active region extending in the first direction, being located at the first level, and being separated from the first active region in a second direction different from the first direction; a first gate structure extending in the second direction, overlapping the first active region and the second active region, and being located at a second level different from the first level; a first side, and a second side being an opposite side of the first cell from the first side; a first rail extending in the first direction, overlapping the first active region, being configured to supply a first supply voltage, and being located at a third level different from the first level and the second level, and a second rail extending in the first direction, being located at the third level, being separated from the first rail in the second direction, being configured to supply a second supply voltage different from the first supply voltage, and the second rail not overlapping the first side or the second side. In some embodiments, the first active region has a first width in the second direction, and the second active region has a second width in the second direction different from the first width. In some embodiments, a center of the second active region is not aligned with a center of the second rail. In some embodiments, the first cell further comprises a second gate structure extending in the second direction, overlapping the first active region and the second active region, and being located at the second level, and a third gate structure extending in the second direction, overlapping the first active region and the second active region, and being located at the second level, the first gate structure being between the second gate structure and the third gate structure, the first gate structure being separated from the second gate structure and the third gate structure in the first direction. In some embodiments, the first cell further comprises a set of fins extending in the first direction and below the first gate structure, each of the fins of the set of fins being separated from an adjacent fin of the set of fins in the second direction by a fin pitch, and a set of vias over the gate structure. In some embodiments, IC structure further comprises a shallow trench isolation (STI) structure separating the first active region from the second active region. In some embodiments, a center of the first rail is aligned with a center of the first active region. In some embodiments, the first cell comprises a third side; a fourth side being an opposite side of the first cell from the third side; a first dummy gate structure extending in the second direction and overlapping the third side, and a second dummy gate structure extending in the second direction and overlapping the fourth side. In some embodiments, the first active region has a first dopant type, and the second active region has a second dopant type different from the first dopant type.

Still another aspect of this description relates to a method of fabricating an integrated circuit structure. The method including generating a first cell layout pattern corresponding to fabricating a first cell of an integrated circuit structure, generating a first rail layout pattern corresponding to fabricating a first rail of the integrated circuit structure, the first rail layout pattern extending in the first direction, overlapping the first active region layout pattern, and being located at a third layout level different from the first layout level and the second layout level, the first rail being configured to supply a first supply voltage, and generating a second rail layout pattern corresponding to fabricating a second rail of the integrated circuit structure, the second rail layout pattern extending in the first direction, being located at the third layout level, and being separated from the first rail layout pattern in the second direction, and the second rail being configured to supply a second supply voltage different from the first supply voltage, the second rail layout pattern not overlapping a first side or a second side of the first cell layout pattern, wherein at least one of the above layout patterns is stored on a non-transitory computer-readable medium, and at least one of the above operations is performed by a hardware processor, manufacturing the integrated circuit structure based on at least one of the above layout patterns of the integrated circuit. In some embodiments, the generating the first cell layout pattern comprises generating a first active region layout pattern corresponding to fabricating a first active region of the integrated circuit structure, the first active region layout pattern extending in a first direction and being located at a first layout level; generating a second active region layout pattern corresponding to fabricating a second active region of the integrated circuit structure, the second active region layout pattern extending in the first direction, being located at the first layout level, and being separated from the first active region layout pattern in a second direction different from the first direction, and generating a first gate layout pattern corresponding to fabricating a first gate structure of the integrated circuit structure, the first gate layout pattern extending in the second direction, overlapping the first active region layout pattern and the second active region layout pattern and being located at a second layout level different from the first layout level. In some embodiments, wherein generating the first cell layout pattern further comprises generating a set of fin layout patterns corresponding to fabricating a set of fins of the integrated circuit structure, the set of fin layout patterns extending in the first direction and below the first gate layout pattern, each of the layout patterns of the set of fin layout patterns being separated from an adjacent layout pattern of the set of fin layout patterns in the second direction by a fin pitch. In some embodiments, generating the first cell layout pattern further comprises generating a shallow trench isolation (STI) layout pattern corresponding to fabricating a STI structure of the integrated circuit structure, the STI layout pattern being between the first active region layout pattern and the second active region layout pattern. In some embodiments, generating the first cell layout pattern further comprises generating a first dummy gate layout pattern corresponding to fabricating a first dummy gate structure of the integrated circuit structure, the first dummy gate layout pattern extending in the second direction and overlapping a third side of the first cell layout pattern, and generating a second dummy gate layout pattern corresponding to fabricating a second dummy gate structure of the integrated circuit structure, the second dummy gate layout pattern extending in the second direction and overlapping a fourth side of the first cell layout pattern, the fourth side of the first cell layout pattern being an opposite side of the first cell layout pattern from the third side of the first cell layout pattern. In some embodiments, generating the first cell layout pattern further comprises generating a set of via layout patterns corresponding to fabricating a set of vias of the integrated circuit structure, the set of via layout patterns being over the first gate layout pattern, the set of vias being coupled to the gate structure. In some embodiments, the method of fabricating the IC structure further comprises generating a second cell layout pattern corresponding to fabricating a second cell of the integrated circuit structure, the second cell layout pattern being adjacent to the first cell layout pattern and having a height different from a height of the first cell layout pattern, the generating the second cell layout pattern comprising: generating a third active region layout pattern corresponding to fabricating a third active region of the integrated circuit structure, the third active region layout pattern extending in the first direction and being located at the first layout level; generating a fourth active region layout pattern corresponding to fabricating a fourth active region of the integrated circuit structure, the fourth active region layout pattern extending in the first direction, being located at the first layout level, and being separated from the third active region layout pattern in the second direction, and generating a second gate layout pattern corresponding to fabricating a second gate structure of the integrated circuit structure, the second gate layout pattern extending in the second direction, overlapping the third active region layout pattern and the fourth active region layout pattern and being located at the second layout level; and generating a third rail layout pattern corresponding to fabricating a third rail of the integrated circuit structure, the third rail layout pattern extending in the first direction, and being located at the third layout level, the third rail being configured to supply the second supply voltage, wherein a center of the first active region layout pattern is aligned with a first side of the second cell layout pattern in the first direction, the first rail layout pattern overlaps the first side of the second cell layout pattern and the center of the first active region layout pattern, and the third rail layout pattern overlaps a second side of the second cell layout pattern, the second side of the second cell layout pattern being an opposite side of the second cell layout pattern from the first side of the second cell layout pattern. In some embodiments, generating the first cell layout pattern further comprises generating a second gate layout pattern corresponding to fabricating a second gate structure of the integrated circuit structure, the second gate layout pattern extending in the second direction, overlapping the first active region layout pattern and the second active region layout pattern, and being located at the second layout level, and generating a third gate layout pattern corresponding to fabricating a third gate structure of the integrated circuit structure, the third gate layout pattern extending in the second direction, overlapping the first active region layout pattern and the second active region layout pattern, and being located at the second layout level.

Still another aspect of this description relates to a method of forming an integrated circuit structure. The method including placing a first cell layout pattern on a layout level, the first cell layout pattern corresponding to fabricating a first cell of an integrated circuit structure; placing a first rail layout pattern on a third layout level different from the first layout level and the second layout level, the first rail layout pattern corresponding to fabricating a first rail of the integrated circuit structure, the first rail being configured to supply a first supply voltage, the first rail layout pattern extending in the first direction and overlapping the first active region layout pattern, and placing a second rail layout pattern on the third layout level, the second rail layout pattern corresponding to fabricating a second rail of the integrated circuit structure, the second rail being configured to supply a second supply voltage different from the first supply voltage, the second rail layout pattern extending in the first direction, overlapping the second active region layout pattern, and being separated from the first rail layout pattern in the second direction; and wherein at least one of the above layout patterns is stored on a non-transitory computer-readable medium, and at least one of the above operations is performed by a hardware processor; and manufacturing the integrated circuit structure based on at least one of the above layout patterns of the integrated circuit. In some embodiments, the placing the first cell layout pattern comprises placing a first active region layout pattern on a first layout level, the first active region layout pattern corresponding to fabricating a first active region of the integrated circuit structure, the first active region layout pattern extending in a first direction; placing a second active region layout pattern on the first layout level, the second active region layout pattern corresponding to fabricating a second active region of the integrated circuit structure, the second active region layout pattern extending in the first direction and being separated from the first active region layout pattern in a second direction different from the first direction; placing a set of fin layout patterns on the layout level, the set of fin layout patterns corresponding to fabricating a set of fins of the integrated circuit structure, the set of fin layout patterns extending in the first direction and being over the first active region layout pattern and the second active region layout pattern, each of the layout patterns of the set of fin layout patterns being separated from an adjacent layout pattern of the set of fin layout patterns in the second direction by a fin pitch, and placing a first gate layout pattern on a second layout level different from the first layout level, the first gate layout pattern corresponding to fabricating a first gate structure of the integrated circuit structure, the first gate layout pattern extending in the second direction, and overlapping the set of fin layout patterns.

In some embodiments, the method of forming the IC structure further comprises placing a second cell layout pattern on the layout level, the second cell layout pattern corresponding to fabricating a second cell of the integrated circuit structure, the second cell layout pattern being adjacent to the first cell layout pattern and having a height different from a height of the first cell layout pattern, the placing the second cell layout pattern comprising: placing a third active region layout pattern on the first layout level, the third active region layout pattern corresponding to fabricating a third active region of the integrated circuit structure, the third active region layout pattern extending in the first direction; placing a fourth active region layout pattern on the first layout level, the fourth active region layout pattern corresponding to fabricating a fourth active region of the integrated circuit structure, the fourth active region layout pattern extending in the first direction, and being separated from the third active region layout pattern in the second direction, and placing a second gate layout pattern on the second layout level, the second gate layout pattern corresponding to fabricating a second gate structure of the integrated circuit structure, the second gate layout pattern extending in the second direction, overlapping the third active region layout pattern and the fourth active region layout pattern; and placing a third rail layout pattern on the third layout level, the third rail layout pattern corresponding to fabricating a third rail of the integrated circuit structure, the third rail layout pattern extending in the first direction, the third rail being configured to supply the second supply voltage, wherein a center of the first active region layout pattern is aligned with a first side of the second cell layout pattern in the first direction, the first rail layout pattern overlaps the first side of the second cell layout pattern and the center of the first active region layout pattern, and the third rail layout pattern overlaps a second side of the second cell layout pattern, the second side of the second cell layout pattern being an opposite side of the second cell layout pattern from the first side of the second cell layout pattern. In some embodiments, placing the first cell layout pattern further comprises: placing a set of via layout patterns over the first gate layout pattern, the set of via layout patterns corresponding to fabricating a set of vias of the integrated circuit structure, the set of vias being coupled to the gate structure. In some embodiments, placing the first cell layout pattern further comprises: placing a first dummy gate layout pattern over a first side of the first cell layout pattern, the first dummy gate layout pattern corresponding to fabricating a first dummy gate structure of the integrated circuit structure, the first dummy gate layout pattern extending in the second direction, and placing a second dummy gate layout pattern over a second side of the first cell layout pattern, the second dummy gate layout pattern corresponding to fabricating a second dummy gate structure of the integrated circuit structure, the second dummy gate layout pattern extending in the second direction, the second side of the first cell layout pattern being an opposite side of the first cell layout pattern from the first side of the first cell layout pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
 a first cell comprising:
  a first active region extending in a first direction and being located at a first level;
  a second active region extending in the first direction, being located at the first level, and being separated from the first active region in a second direction different from the first direction, and
  a first gate structure extending in the second direction, overlapping the first active region and the second active region, and being located at a second level different from the first level;
 a first rail extending in the first direction, overlapping the first active region, being configured to supply a first supply voltage, and being located at a third level different from the first level and the second level, and
 a second rail extending in the first direction, overlapping the second active region, being located at the third level, being separated from the first rail in the second direction, and being configured to supply a second supply voltage different from the first supply voltage.

2. The integrated circuit structure of claim 1, wherein the first cell further comprises:
a set of fins extending in the first direction and below the first gate structure, each fin of the set of fins being separated from an adjacent fin of the set of fins in the second direction by a fin pitch.

3. The integrated circuit structure of claim 1, wherein the first cell further comprises:
a shallow trench isolation (STI) structure between the first active region and the second active region.

4. The integrated circuit structure of claim 1, wherein at least the first rail overlaps a center of the first active region, or the second rail overlaps a center of the second active region.

5. The integrated circuit structure of claim 1, wherein the first cell further comprises:
a first side;
a second side being an opposite side of the first cell from the first side;
a first dummy gate structure extending in the second direction and overlapping the first side, and
a second dummy gate structure extending in the second direction and overlapping the second side.

6. The integrated circuit structure of claim 1, further comprising:
a set of vias over the first gate structure, a first via of the set of vias being separated from a second via of the set of vias in the second direction.

7. The integrated circuit structure of claim 1, wherein
the first active region has a first dopant type, and
the second active region has a second dopant type different from the first dopant type.

8. The integrated circuit structure of claim 1, further comprising:
a second cell adjacent to the first cell, the second cell comprising:
a third active region extending in the first direction and being located at the first level;
a fourth active region extending in the first direction, being located at the first level, and being separated from the third active region in the second direction;
a second gate structure extending in the second direction, overlapping the third active region and the fourth active region and being located at the second level;
a first side, and
a second side being an opposite side of the second cell from the first side,
wherein a center of the first active region is aligned with the first side of the second cell in the first direction, the first rail overlaps the first side of the second cell and the center of the first active region, and a height of the first cell is different from a height of the second cell.

9. The integrated circuit structure of claim 8, further comprising:
a third rail extending in the first direction, overlapping the second side of the second cell, being configured to supply the second supply voltage, and being located at the third level.

10. The integrated circuit structure of claim 8, wherein the second cell comprises:
a third side;
a fourth side being an opposite side of the second cell from the third side;
a first dummy gate structure extending in the second direction and overlapping the third side, and
a second dummy gate structure extending in the second direction and overlapping the fourth side.

11. A method of fabricating an integrated circuit structure, the method comprising:
placing a first cell layout pattern on a layout level, the first cell layout pattern corresponding to fabricating a first cell of the integrated circuit structure, the first cell layout pattern comprising a first side and a second side on an opposite side of the first cell from the first side, the placing the first cell layout pattern comprising:
placing a first active region layout pattern on a first layout level, the first active region layout pattern corresponding to fabricating a first active region of the integrated circuit structure, the first active region layout pattern extending in a first direction;
placing a second active region layout pattern on the first layout level, the second active region layout pattern corresponding to fabricating a second active region of the integrated circuit structure, the second active region layout pattern extending in the first direction and being separated from the first active region layout pattern in a second direction different from the first direction; and
placing a first gate layout pattern on a second layout level different from the first layout level, the first gate layout pattern corresponding to fabricating a first gate structure of the integrated circuit structure, the first gate layout pattern extending in the second direction, and overlapping the first active region layout pattern and the second active region layout pattern;
placing a first rail layout pattern on a third layout level different from the first layout level and the second layout level, the first rail layout pattern corresponding to fabricating a first rail of the integrated circuit structure, the first rail being configured to supply a first supply voltage, the first rail layout pattern extending in the first direction and overlapping the first active region layout pattern; and
placing a second rail layout pattern on the third layout level, the second rail layout pattern corresponding to fabricating a second rail of the integrated circuit structure, the second rail being configured to supply a second supply voltage different from the first supply voltage, the second rail layout pattern extending in the first direction, and being separated from the first rail layout pattern in the second direction, the second rail layout pattern not overlapping a first side or a second side of the first cell layout pattern,
wherein at least one of the above layout patterns is stored on a non-transitory computer-readable medium, and at least one of the above operations is performed by a hardware processor; and
manufacturing the integrated circuit structure based on at least one of the above layout patterns of the integrated circuit structure.

12. The method of claim 11, wherein the placing the first cell layout pattern further comprises:
placing a set of fin layout patterns on the layout level, the set of fin layout patterns corresponding to fabricating a set of fins of the integrated circuit structure, the set of fin layout patterns extending in the first direction and being below the first gate layout pattern, each of the layout patterns of the set of fin layout patterns being separated from an adjacent layout pattern of the set of fin layout patterns in the second direction by a fin pitch.

13. The method of claim 11, wherein the placing the first cell layout pattern further comprises:
    placing a first dummy gate layout pattern over a third side of the first cell layout pattern, the first dummy gate layout pattern corresponding to fabricating a first dummy gate structure of the integrated circuit structure, the first dummy gate layout pattern extending in the second direction, and
    placing a second dummy gate layout pattern over a fourth side of the first cell layout pattern, the second dummy gate layout pattern corresponding to fabricating a second dummy gate structure of the integrated circuit structure, the second dummy gate layout pattern extending in the second direction, the fourth side of the first cell layout pattern being an opposite side of the first cell layout pattern from the third side of the first cell layout pattern.

14. The method of claim 11, wherein the placing the first cell layout pattern further comprises:
    placing a set of via layout patterns over the first gate layout pattern, the set of via layout patterns corresponding to fabricating a set of vias of the integrated circuit structure, the set of vias being coupled to the first gate structure.

15. The method of claim 11, further comprising:
    placing a second cell layout pattern on the layout level, the second cell layout pattern corresponding to fabricating a second cell of the integrated circuit structure, the second cell layout pattern being adjacent to the first cell layout pattern and having a height different from a height of the first cell layout pattern, the placing the second cell layout pattern comprising:
        placing a third active region layout pattern on the first layout level, the third active region layout pattern corresponding to fabricating a third active region of the integrated circuit structure, the third active region layout pattern extending in the first direction;
        placing a fourth active region layout pattern on the first layout level, the fourth active region layout pattern corresponding to fabricating a fourth active region of the integrated circuit structure, the fourth active region layout pattern extending in the first direction, and being separated from the third active region layout pattern in the second direction, and
        placing a second gate layout pattern on the second layout level, the second gate layout pattern corresponding to fabricating a second gate structure of the integrated circuit structure, the second gate layout pattern extending in the second direction, overlapping the third active region layout pattern and the fourth active region layout pattern; and
        placing a third rail layout pattern on the third layout level, the third rail layout pattern corresponding to fabricating a third rail of the integrated circuit structure, the third rail layout pattern extending in the first direction, the third rail being configured to supply the second supply voltage, wherein
    a center of the first active region layout pattern is aligned with a first side of the second cell layout pattern in the first direction,
    the first rail layout pattern overlaps the first side of the second cell layout pattern and the center of the first active region layout pattern, and
    the third rail layout pattern overlaps a second side of the second cell layout pattern, the second side of the second cell layout pattern being an opposite side of the second cell layout pattern from the first side of the second cell layout pattern.

16. A method of forming an integrated circuit structure, the method comprising:
    generating a first cell layout pattern corresponding to fabricating a first cell of the integrated circuit structure, the generating the first cell layout pattern comprising:
        generating a first active region layout pattern corresponding to fabricating a first active region of the integrated circuit structure; and
        generating a second active region layout pattern corresponding to fabricating a second active region of the integrated circuit structure, the first active region layout pattern and the second active region layout pattern extending in a first direction and being located at a first layout level, and the second active region layout pattern being separated from the first active region layout pattern in a second direction different from the first direction; and
    generating a first rail layout pattern corresponding to fabricating a first rail of the integrated circuit structure, the first rail layout pattern extending in the first direction, overlapping the first active region layout pattern, and being located at a second layout level different from the first layout level, the first rail being configured to supply a first supply voltage,
    wherein at least one of the above layout patterns is stored on a non-transitory computer-readable medium, and at least one of the above operations is performed by a hardware processor; and
    manufacturing the integrated circuit structure based on at least one of the above layout patterns of the integrated circuit structure.

17. The method of claim 16, wherein the generating the first cell layout pattern further comprises:
    generating a first gate layout pattern corresponding to fabricating a first gate structure of the integrated circuit structure, the first gate layout pattern extending in the second direction, overlapping the first active region layout pattern and the second active region layout pattern, and being located at a third layout level different from the first layout level and the second layout level.

18. The method of claim 17, further comprising:
    generating a second rail layout pattern corresponding to fabricating a second rail of the integrated circuit structure, the second rail layout pattern extending in the first direction, overlapping the second active region layout pattern, being located at the second layout level, being separated from the first rail layout pattern in the second direction, and the second rail being configured to supply a second supply voltage different from the first supply voltage.

19. The method of claim 18, wherein the generating the first cell layout pattern further comprises:
    generating a set of fin layout patterns corresponding to fabricating a set of fins of the integrated circuit structure, the set of fin layout patterns extending in the first direction and below the first gate layout pattern, each layout pattern of the set of fin layout patterns being separated from an adjacent layout pattern of the set of fin layout patterns in the second direction by a fin pitch;
    generating a set of via layout patterns corresponding to fabricating a set of vias of the integrated circuit structure, the set of via layout patterns being over the first gate layout pattern, the set of vias being coupled to the first gate structure;

generating a shallow trench isolation (STI) layout pattern corresponding to fabricating a STI structure of the integrated circuit structure, the STI layout pattern being between the first active region layout pattern and the second active region layout pattern;

generating a first dummy gate layout pattern corresponding to fabricating a first dummy gate structure of the integrated circuit structure, the first dummy gate layout pattern extending in the second direction and overlapping a first side of the first cell layout pattern, and generating a second dummy gate layout pattern corresponding to fabricating a second dummy gate structure of the integrated circuit structure, the second dummy gate layout pattern extending in the second direction and overlapping a second side of the first cell layout pattern, the second side of the first cell layout pattern being an opposite side of the first cell layout pattern from the first side of the first cell layout pattern.

20. The method of claim 19, further comprising:

generating a second cell layout pattern corresponding to fabricating a second cell of the integrated circuit structure, the second cell layout pattern being adjacent to the first cell layout pattern and having a height different from a height of the first cell layout pattern, the generating the second cell layout pattern comprising:

generating a third active region layout pattern corresponding to fabricating a third active region of the integrated circuit structure, the third active region layout pattern extending in the first direction and being located at the first layout level;

generating a fourth active region layout pattern corresponding to fabricating a fourth active region of the integrated circuit structure, the fourth active region layout pattern extending in the first direction, being located at the first layout level, and being separated from the third active region layout pattern in the second direction, and generating a second gate layout pattern corresponding to fabricating a second gate structure of the integrated circuit structure, the second gate layout pattern extending in the second direction, overlapping the third active region layout pattern and the fourth active region layout pattern and being located at the third layout level; and generating a third rail layout pattern corresponding to fabricating a third rail of the integrated circuit structure, the third rail layout pattern extending in the first direction, and being located at the second layout level, the third rail being configured to supply the second supply voltage, wherein a center of the first active region layout pattern is aligned with a first side of the second cell layout pattern in the first direction, the first rail layout pattern overlaps the first side of the second cell layout pattern and the center of the first active region layout pattern, and the third rail layout pattern overlaps a second side of the second cell layout pattern, the second side of the second cell layout pattern being an opposite side of the second cell layout pattern from the first side of the second cell layout pattern.

* * * * *